US012100746B2

(12) United States Patent
Frougier et al.

(10) Patent No.: US 12,100,746 B2
(45) Date of Patent: Sep. 24, 2024

(54) GATE-ALL-AROUND FIELD EFFECT TRANSISTOR WITH BOTTOM DIELECTRIC ISOLATION

(71) Applicant: International Business Machines Corporation, Armonk, NY (US)

(72) Inventors: Julien Frougier, Albany, NY (US); Nicolas Loubet, Guilderland, NY (US); Andrew M. Greene, Slingerlands, NY (US); Ruilong Xie, Niskayuna, NY (US); Maruf Amin Bhuiyan, Albany, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 451 days.

(21) Appl. No.: 17/518,515

(22) Filed: Nov. 3, 2021

(65) Prior Publication Data
US 2023/0133545 A1 May 4, 2023

(51) Int. Cl.
*H01L 29/423* (2006.01)
*H01L 29/06* (2006.01)
*H01L 29/66* (2006.01)

(52) U.S. Cl.
CPC .... *H01L 29/42392* (2013.01); *H01L 29/0653* (2013.01); *H01L 29/0673* (2013.01); *H01L 29/66545* (2013.01)

(58) Field of Classification Search
CPC ........... H01L 29/42392; H01L 29/0653; H01L 29/7848; H01L 29/0673; H01L 29/66545; H01L 29/165; H01L 21/823878; H01L 29/775; H01L 29/78696
See application file for complete search history.

(56) References Cited

U.S. PATENT DOCUMENTS

| | | |
|---|---|---|
| 9,947,804 B1 | 4/2018 | Frougier |
| 10,103,238 B1 | 10/2018 | Zang |
| 10,332,961 B2 | 6/2019 | Cheng |
| 10,388,727 B2 | 8/2019 | Ando |
| 10,453,824 B1 | 10/2019 | Mochizuki |
| 10,468,311 B2 | 11/2019 | Reznicek |

(Continued)

OTHER PUBLICATIONS

"A Method and Structure to form Air Sub-sheet Isolation for Horizontal GAA Devices", IPCOM000257935D, An IP.com Prior Art Database Technical Disclosure, 3 pps., Mar. 25, 2019.
"Bottom Airgap Spacer Formation for Gate-all-around FET with Bulk Substrate", IPCOM000256575D, An IP.com Prior Art Database Technical Disclosure, 7 pps., Dec. 11, 2018.
"Stacked Gate-All-Around Nanosheet Structures with Bottom Dielectric Isolation", IPCOM000261657D, An IP.com Prior Art Database Technical Disclosure, 5 pps., Mar. 24, 2020.

(Continued)

*Primary Examiner* — Changhyun Yi
(74) *Attorney, Agent, or Firm* — David K. Mattheis

(57) ABSTRACT

A semiconductor device includes a semiconductor substrate, a first pair of FET (field effect transistor) gate structures separated by a first gate canyon having a first gate canyon spacing, disposed upon the semiconductor substrate, a second pair of FET gate structures separated by a second gate canyon having a second gate canyon spacing, disposed upon the substrate, a first S/D (source/drain region disposed in the first gate canyon, a second S/D region disposed in the second gate canyon, a first BDI (bottom dielectric isolation) element disposed below the first S/D region and having a first BDI thickness, and a second BDI element disposed below the second S/D region and having a second BDI thickness. The first BDI thickness exceeds the second BDI thickness.

19 Claims, 24 Drawing Sheets

(56) References Cited

U.S. PATENT DOCUMENTS

| | | |
|---|---|---|
| 10,559,656 B2 | 2/2020 | Bourjot |
| 10,840,329 B1 | 11/2020 | Xie |
| 2015/0021690 A1 | 1/2015 | Jacob |
| 2015/0056781 A1 | 2/2015 | Akarvardar |
| 2015/0162436 A1 | 6/2015 | Toh |
| 2015/0221726 A1 | 8/2015 | Wong |
| 2016/0197004 A1 | 7/2016 | Akarvardar |
| 2017/0229555 A1* | 8/2017 | Balakrishnan ...... H01L 29/7853 |
| 2019/0312104 A1 | 10/2019 | Cheng |
| 2020/0105868 A1 | 4/2020 | Loubet |
| 2020/0105869 A1 | 4/2020 | Loubet |
| 2020/0357884 A1 | 11/2020 | Xie |
| 2021/0119031 A1 | 4/2021 | Song |
| 2021/0134721 A1 | 5/2021 | Chiang |
| 2021/0226034 A1 | 7/2021 | Xie |

OTHER PUBLICATIONS

Yoon et al., "Punch-Through-Stopper Free Nanosheet FETs With Crescent Inner-Spacer and Isolated Source/Drain," In IEEE Access, vol. 7, pP. 38593-38596, 2019, doi: 10.1109/ACCESS.2019.2904944.

"Patent Cooperation Treaty PCT Notification of Transmittal of the International Search Report and the Written Opinion of the International Searching Authority, or the Declaration", Applicant's file reference P202008087PCT, International application No. PCT/ EP2022/ 078469, International filing Date Oct. 13, 2022, Date of mailing Feb. 2, 2023, 15 pages.

Disclosed Anonymously et al., "Nanosheet Dielectric Isolation Through Self-Aligned Directional Process", ip.com Prior Art Database Technical Disclosure, IPCOM000253327D, Mar. 22, 2018, 8 Pgs.

* cited by examiner

GATE-ALL-AROUND FIELD EFFECT TRANSISTOR WITH BOTTOM DIELECTRIC ISOLATION

BACKGROUND

The disclosure relates generally to gate-all-around (GAA) field effect transistor (FET) devices. The disclosure relates particularly to GAA FET devices having bottom dielectric isolation (BDI).

Horizontal GAA device design represent a promising device architecture for downscaling FET structures. Typical designs may include punch through stopper isolation elements to reduce leakage currents passing through the underlying substrate between device source and drain regions.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device includes a semiconductor substrate, a first pair of FET (field effect transistor) gate structures separated by a first gate canyon having a first gate canyon spacing, disposed upon the semiconductor substrate, a second pair of FET gate structures separated by a second gate canyon having a second gate canyon spacing, disposed upon the substrate, a first S/D (source/drain region disposed in the first gate canyon, a second S/D region disposed in the second gate canyon, a first BDI (bottom dielectric isolation) element disposed below the first S/D region and having a first BDI thickness, and a second BDI element disposed below the second S/D region and having a second BDI thickness. The first BDI thickness exceeds the second BDI thickness.

In one aspect, a semiconductor device includes a semiconductor substrate, a first pair of FET (field effect transistor) gate structures separated by a first gate canyon having a first gate canyon spacing disposed upon the semiconductor substrate, a first S/D (source/drain region disposed in the first gate canyon, and a first BDI (bottom dielectric isolation) element disposed below the first pair of FET gate structures and the first S/D region. The first BDI element comprises a first thickness below the first pair of FET gate structures and a second thickness below the first S/D region, and the first S/D region extends below an upper surface of the first BDI element.

In one aspect, a method of fabricating a semiconductor device includes forming a nanosheet layer stack including a bottom sacrificial nanosheet layer, forming fins from the nanosheet stack, forming dummy gates upon the fins, recessing the fins between otherwise adjacent dummy gates, removing the bottom sacrificial nanosheet layer, forming a bottom dielectric isolation layer below the nanosheet stack, recessing the bottom dielectric isolation layer between otherwise adjacent dummy gates, and forming source/drain regions adjacent to the bottom dielectric layer and the otherwise adjacent dummy gates.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1A:
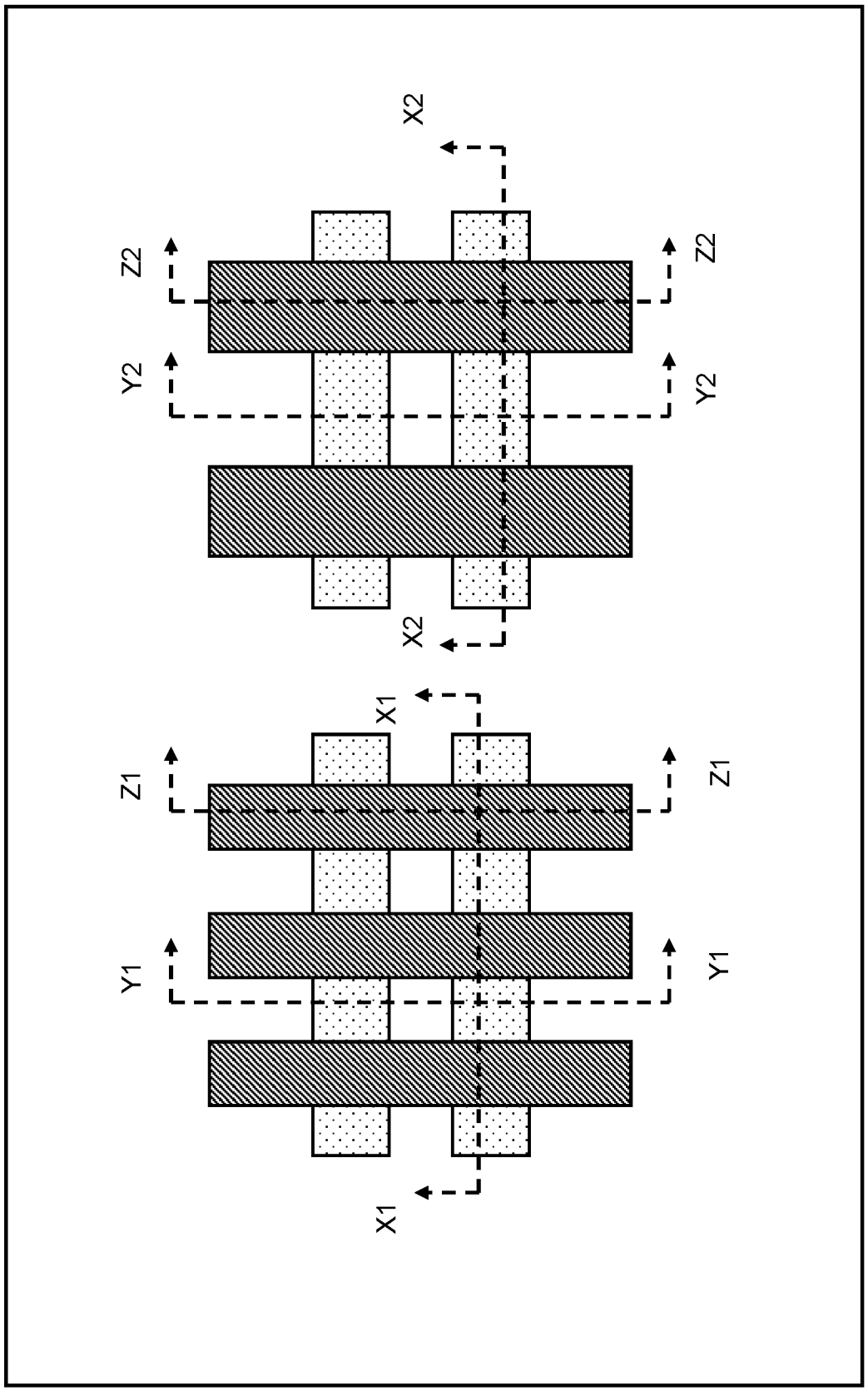
FIG. 1A provides a plan view of two regions of a single device, according to an embodiment of the invention. The figures illustrates the section lines of the respective views of the device illustrated in FIGS. 1B-11, and 13-22.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Gate-all-around nanosheet FET devices may suffer parasitic leakage currents through a bottom parasitic channel consisting of the substrate disposed beneath the gate structure between the source and drain regions of the device. Punch through stoppers may be formed to alleviate these parasitic currents to a greater or lesser extent. Full bottom dielectric isolation may also be formed to further isolate the source/drain regions from the parasitic channel of the substrate. The severity of the parasitic currents varies with the gate length of the device, where gate length refers to the x-dimension of the gate stack of the device. As gate length diminishes, the need for bottom isolation increases as the propensity for bottom channel parasitic current rises. Device having larger gate lengths tend to have reduced parasitic channel current issues. Disclosed structures and methods provide for device having a combination of narrow gate lengths at the same device level as wider gate lengths, requiring a combination of bottom isolation structures to address the needs of the narrow gate length elements of the device together with the bottom isolation needs of the device elements having wider gate lengths.

Reference is now made to the figures. The figures provide schematic cross-sectional illustration of semiconductor devices at intermediate stages of fabrication, according to one or more embodiments of the invention. The figures provide front cross-sections parallel to device fins and side cross-sections parallel to device gates. The figures provide schematic representations of the devices of the invention and are not to be considered accurate or limiting with regards to device element scale.

Figure 1B:
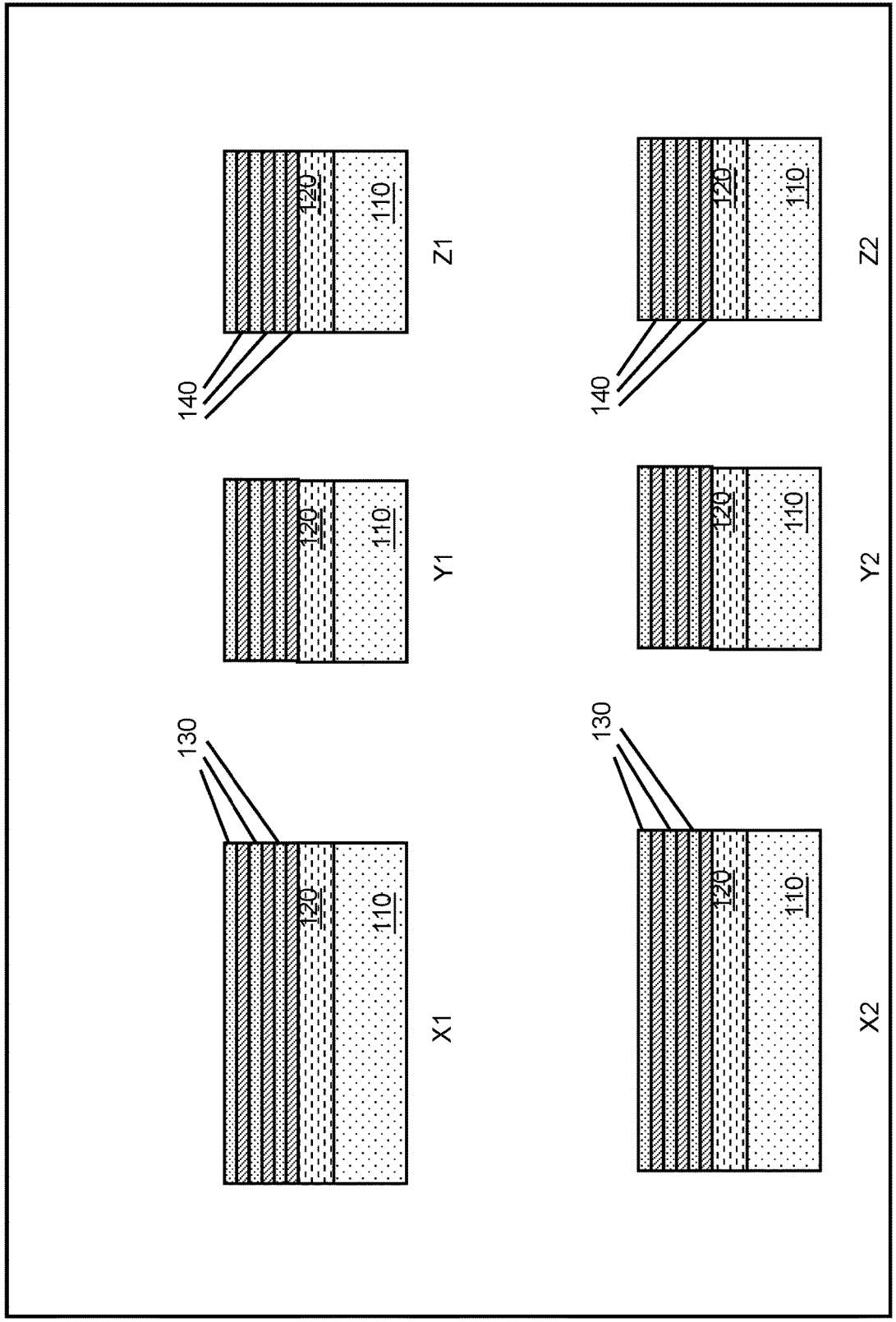
FIG. 1B provides cross sectional views of a step in the fabrication of a semiconductor device, according to an embodiment of the invention. The figure illustrates a formed stack of alternating nanosheet upon a substrate and sacrificial semiconductor layer.

FIG. 1 provides schematic views of a device according to an embodiment of the invention following the deposition of a stack of layers for the formation of FET device nanosheets. In an embodiment, the stack includes alternating layers of epitaxially grown silicon germanium 140, 120, and silicon 130. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The nanosheet stack includes a bottom-most layer of a first semiconductor material, such as SiGe, and alternating layers of a second semiconductor material, such as a SiGe having a lower Ge concentration and a semiconductor material such as Si. The nanosheet stack is depicted with seven layers (three SiGe layers and three Si layers forming a device, and a single high Ge concentration, e.g., 40%-70% Ge, SiGe layer 120, separating the device stack from the underlying semiconductor substrate 110. However, any number and combination of layers can be used so long as the layers alternate between SiGe and Si to form a device and include a high Ge concentration SiGe layer separating the device from the substrate. The nanosheet stack is depicted with the layers being in the form of nanosheets, however the width of any given nanosheet layer can be varied so as to result in the form of a nanowire, a nanowire, etc. SiGe layers 140, 120, can be composed of, for instance, SiGe$_{15-35}$, examples thereof including, but not limited to SiGe$_{15}$, SiGe$_{20}$, SiGe$_{25}$ . . . SiGe$_{35}$.

Substrate 110 can be composed of any currently known or later developed semiconductor material, which may include without limitation, silicon, germanium, silicon carbide, and those consisting essentially of one or more III-V compound semiconductors having a composition defined by the formula Al$_{X1}$Ga$_{X2}$In$_{X3}$As$_{Y1}$P$_{Y2}$N$_{Y3}$Sb$_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition Zn$_{A1}$Cd$_{A2}$Se$_{B1}$Te$_{B2}$, where A1, A2, B1, and B2 are relative proportions each greater than or equal to zero and A1+A2+B1+B2=1 (1 being a total mole quantity).

In an embodiment, each sacrificial semiconductor material layer 140 and 120, is composed of a first semiconductor material which differs in composition from at least an upper portion of the semiconductor substrate 110. In one embodiment, the upper portion of the semiconductor substrate 110 is composed of silicon, while each sacrificial semiconductor material layers 140 and 120 is composed of a silicon germanium alloy. In such an embodiment, the SiGe alloy that provides each sacrificial semiconductor material layer 120 has a germanium content that is greater than 45 atomic percent germanium. In one example, the SiGe alloy that provides each sacrificial semiconductor material layer 120 has a germanium content from 45 atomic percent germanium to 70 atomic percent germanium. In such an embodiment, the SiGe alloy that provides each sacrificial semiconductor material layer 140 has a germanium content that is less than 45 atomic percent germanium. In one example, the SiGe alloy that provides each sacrificial semiconductor material layer 140 has a germanium content from 15 atomic percent germanium to 35 atomic percent germanium. The first semiconductor material that provides each sacrificial semiconductor material layers 140 and 120 can be formed utilizing an epitaxial growth (or deposition process).

Each semiconductor channel material layer 130, is composed of a second semiconductor material that has a different etch rate than the first semiconductor material of the sacrificial semiconductor material layers 140 and 120 and is also resistant to Ge condensation. The second semiconductor material of each semiconductor channel material layer 130, may be the same as, or different from, the semiconductor material of at least the upper portion of the semiconductor substrate 110. The second semiconductor material can be a SiGe alloy provided that the SiGe alloy has a germanium content that is less than 45 atomic percent germanium, and that the first semiconductor material is different from the second semiconductor material.

In one example, at least the upper portion of the semiconductor substrate 110 and each semiconductor channel material layer 130 is composed of Si or a III-V compound semiconductor, while each sacrificial semiconductor material layer 140, 120 is composed of a silicon germanium alloy. The second semiconductor material of each semiconductor channel material layer 130, can be formed utilizing an epitaxial growth (or deposition process).

Figure 2:
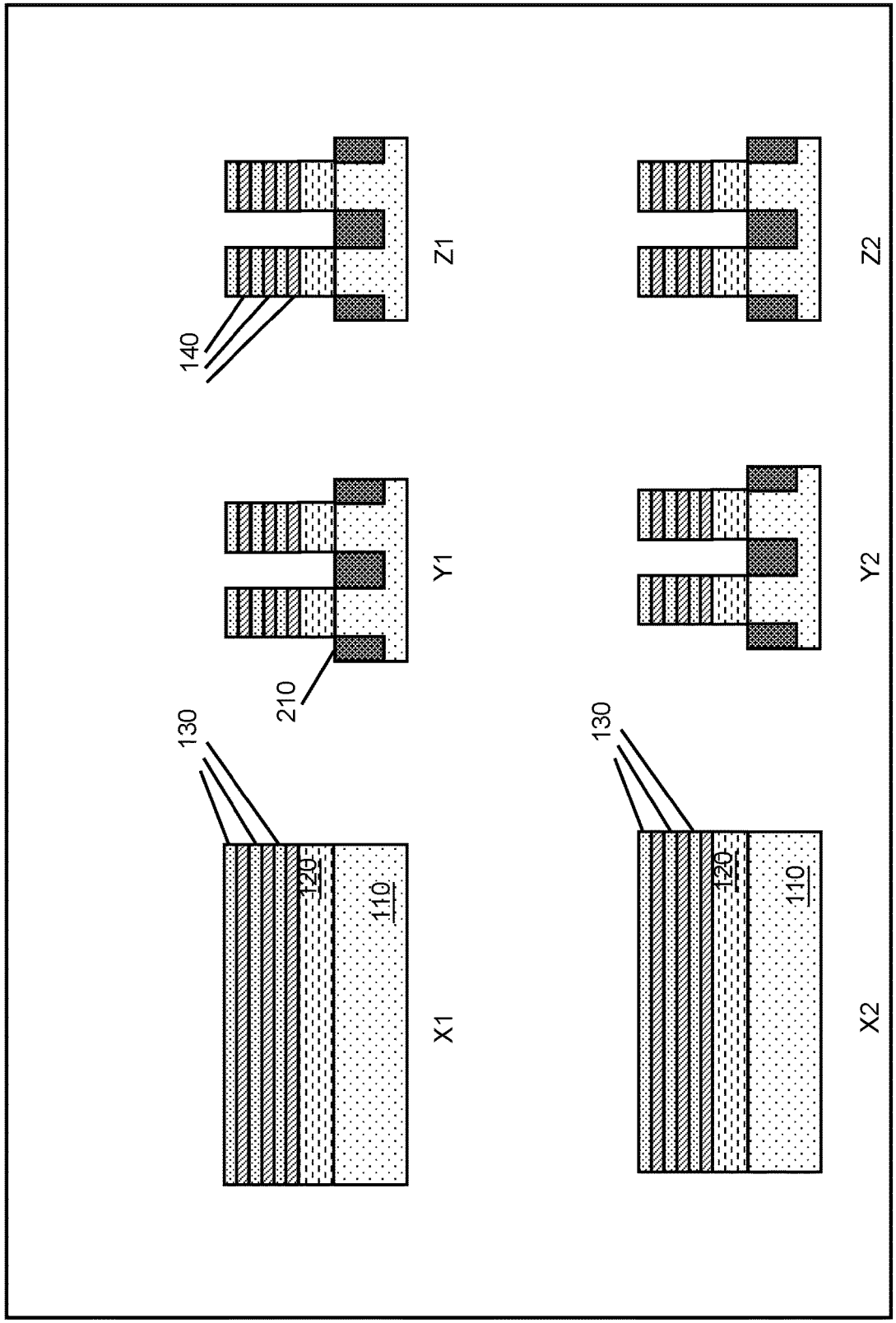
FIG. 2 provides cross sectional views of a step in the fabrication of a semiconductor device, according to an embodiment of the invention. The figure illustrates the device after the formation of device fins from the nanosheet stack and deposition of shallow trench isolation materials.

As shown in FIG. 2, fabrication of the device proceeds with the patterning, masking and selective etching of the stack of nanosheet layers to form individual nanosheet fin stacks. In an embodiment, the stack includes alternating layers of epitaxially grown silicon germanium 140, 120, and silicon 130. Other materials having similar properties may be used in place of the SiGe and Si. In an embodiment, reactive ion etching recesses exposed nanosheet stack portions yielding the desired nano sheet stack fins.

In an embodiment, the etching proceeds into substrate 110. Deposition of a shallow trench isolation (STI) material 210, such as silicon dioxide, or any suitable combination of multiple dielectric materials (e.g., silicon nitride and silicon oxide), occurs after the formation of shallow trench isolation (STI) regions between nanosheet stack circuit elements of the device. Following such deposition, chemical mechanical planarization (CMP) processes smooth the upper surface of the deposited oxide in preparation for the subsequent fabrication steps. An oxide recess process trims the upper surface of STI regions to the level of the bottom sacrificial semiconductor layer 120. STI regions 210 provide electrical isolation between adjacent NS transistors.

Figure 3:
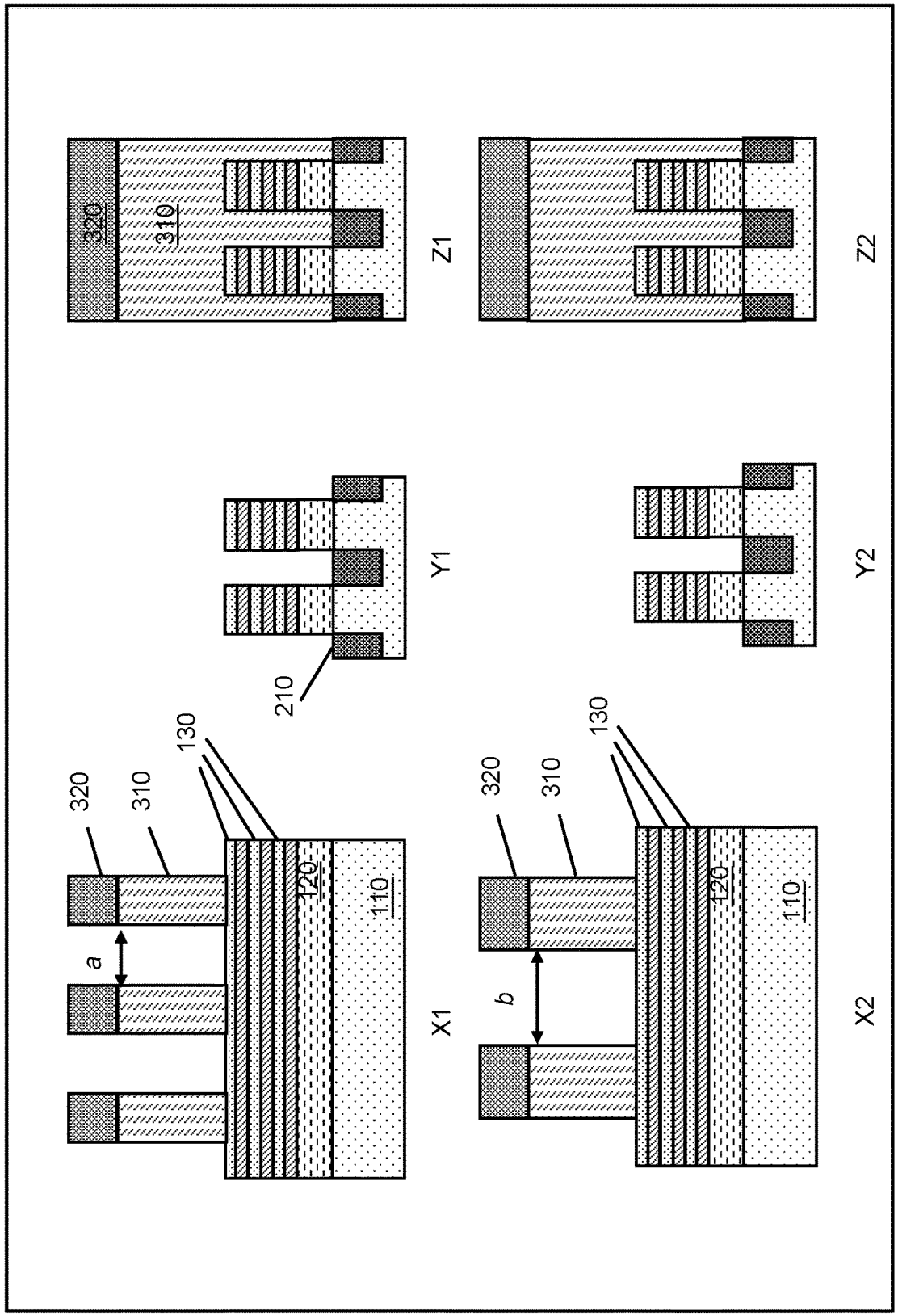
FIG. 3 provides cross sectional views of a step in the fabrication of a semiconductor device, according to an embodiment of the invention. The figure illustrates the device after the formation of dummy gate structures.

FIG. 3 illustrates the device following the forming of at least one dummy gate structure on the nanosheet stack. Three dummy gates are shown however any number of gates can be formed. Different portions of a single device may comprise gate elements having differing gate canyon spacings—the spacing between adjacent gate structures. Dummy gate structures can be formed by depositing a dummy gate material 310 over the nanosheet stack. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The dummy gate material 310 can be, for example, a thin layer of oxide, followed by polycrystalline silicon, amorphous silicon or microcrystal silicon. After that, a hardmask layer 320 is deposited over the dummy gate, followed by lithographic patterning and masking and selective etching processes.

Hard mask 320 includes a nitride, oxide, an oxide-nitride bilayer, or another suitable material. In some embodiments, the hardmask 320 may include an oxide such as silicon oxide (SiO), a nitride such as silicon nitride (SiN), an oxynitride such as silicon oxynitride (SiON), combinations thereof, etc. In some embodiments, the hardmask 320 is a silicon nitride such as Si$_3$N$_4$.

Figure 4:
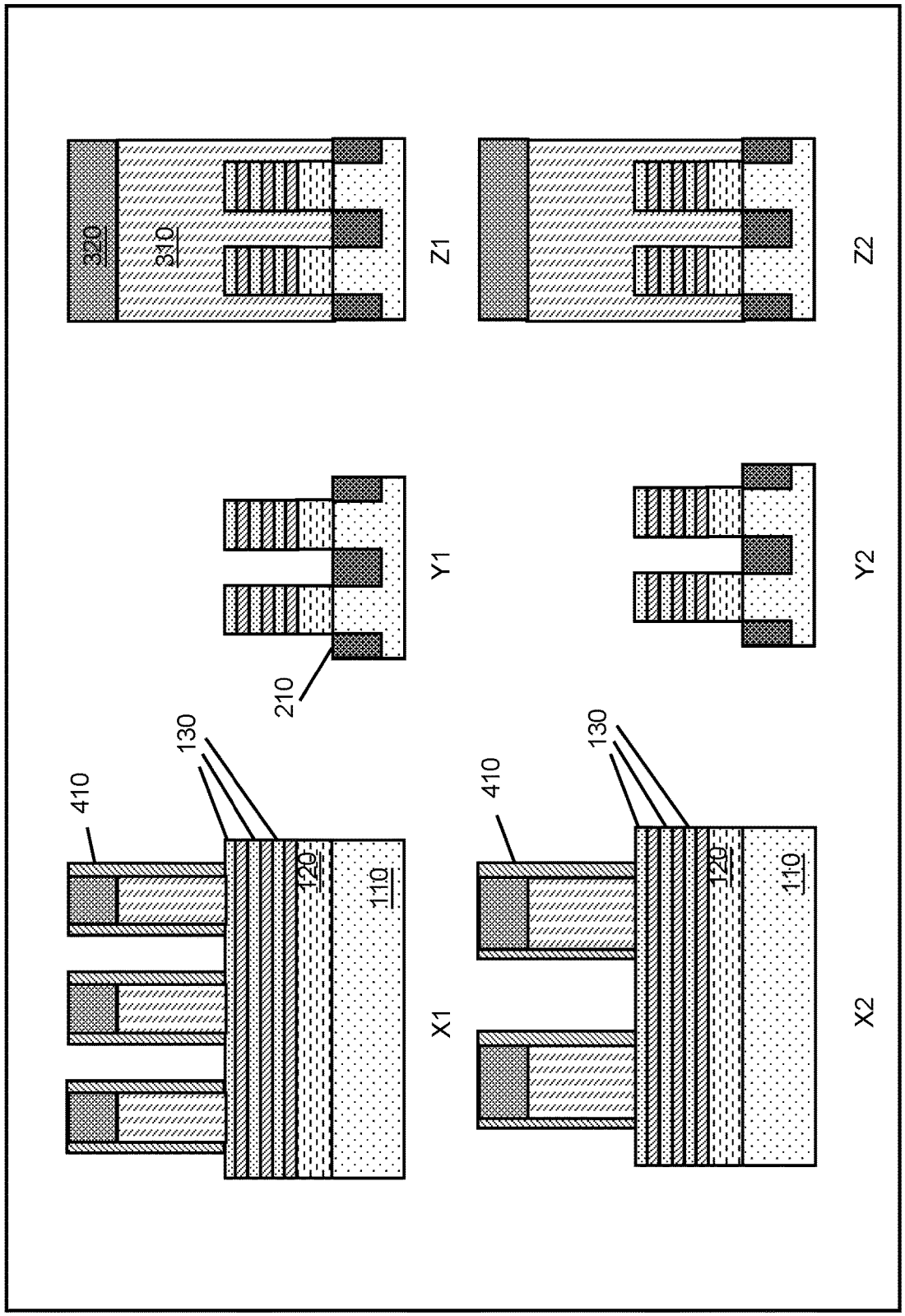
FIG. 4 provides cross sectional views, of a step in the fabrication of a semiconductor device, according to an embodiment of the invention. The figure illustrates the device after the formation of gate sidewall spacers.

FIG. 4 illustrates the device following the deposition and subsequent etching, such as anisotropic etching to remove material from horizontal surfaces, of gate sidewall spacers 410 adjacent to the vertical surfaces of dummy gate materials 310 and hardmask 320. In an embodiment, gate sidewall material 410, may be the same material as hardmask 320, or may be different materials and may be comprised of any one or more of a variety of different insulative materials, such as Si$_3$N$_4$, SiBCN, SiNC, SiN, SiCO, SiO$_2$, SiNOC, etc. In this embodiment, after conformal deposition, selective etching, such as anisotropic reactive ion etching, removes gate sidewall spacer material 410 from horizontal surfaces of the intermediate stage of the device.

Figure 5:
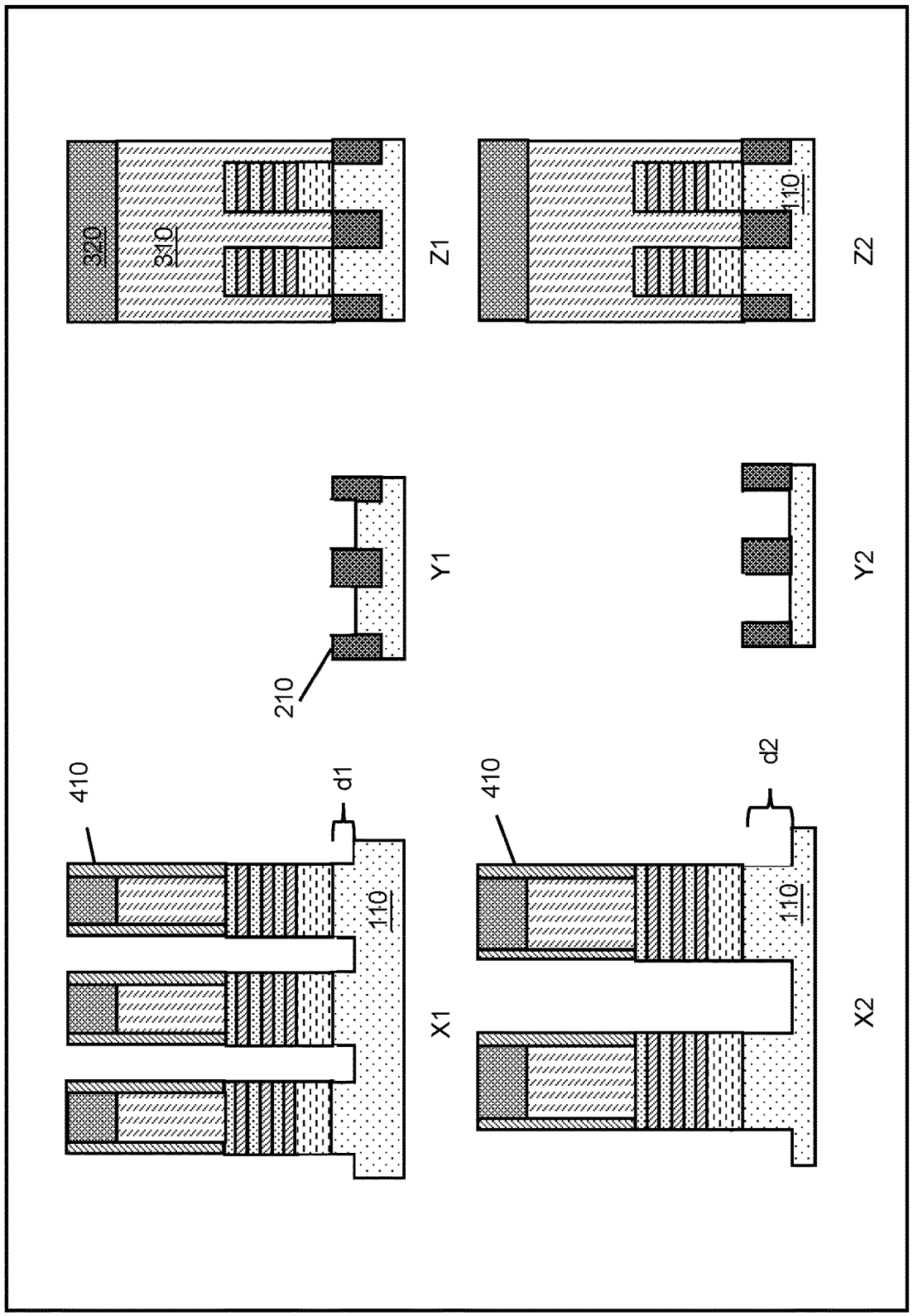
FIG. 5 provides cross sectional views of a step in the fabrication of a semiconductor device, according to an embodiment of the invention. The figure illustrates the device after recessing the fins between adjacent dummy gates.

FIG. 5 illustrates the device following the selective masking and etching of nanosheets between dummy gate structures, yielding individual gate structures. Selective anisotropic etching such as RIE removes portions of the alternating sacrificial layers 140 and channel layers 130 from between adjacent dummy gate structures as well as sacrificial layer 120 and upper portions of substrate 110. Protective gate sidewall spacers 410 prevent damage to the dummy gate structures. The nanosheet layer portions are removed to a level beyond the upper surface of the substrate 110. The depth of the recess relates directly to the width of the gate canyon between otherwise adjacent gate structures. Deeper recesses form between more widely separated gates than those between narrowly separated gates. As shown in the Figure, recess d2 into substrate 110 exceeds the depth of recess d1 into substrate 110 due to the larger relative width of the gate canyon b to gate canyon a. As a<b, d1<d2.

Figure 6:
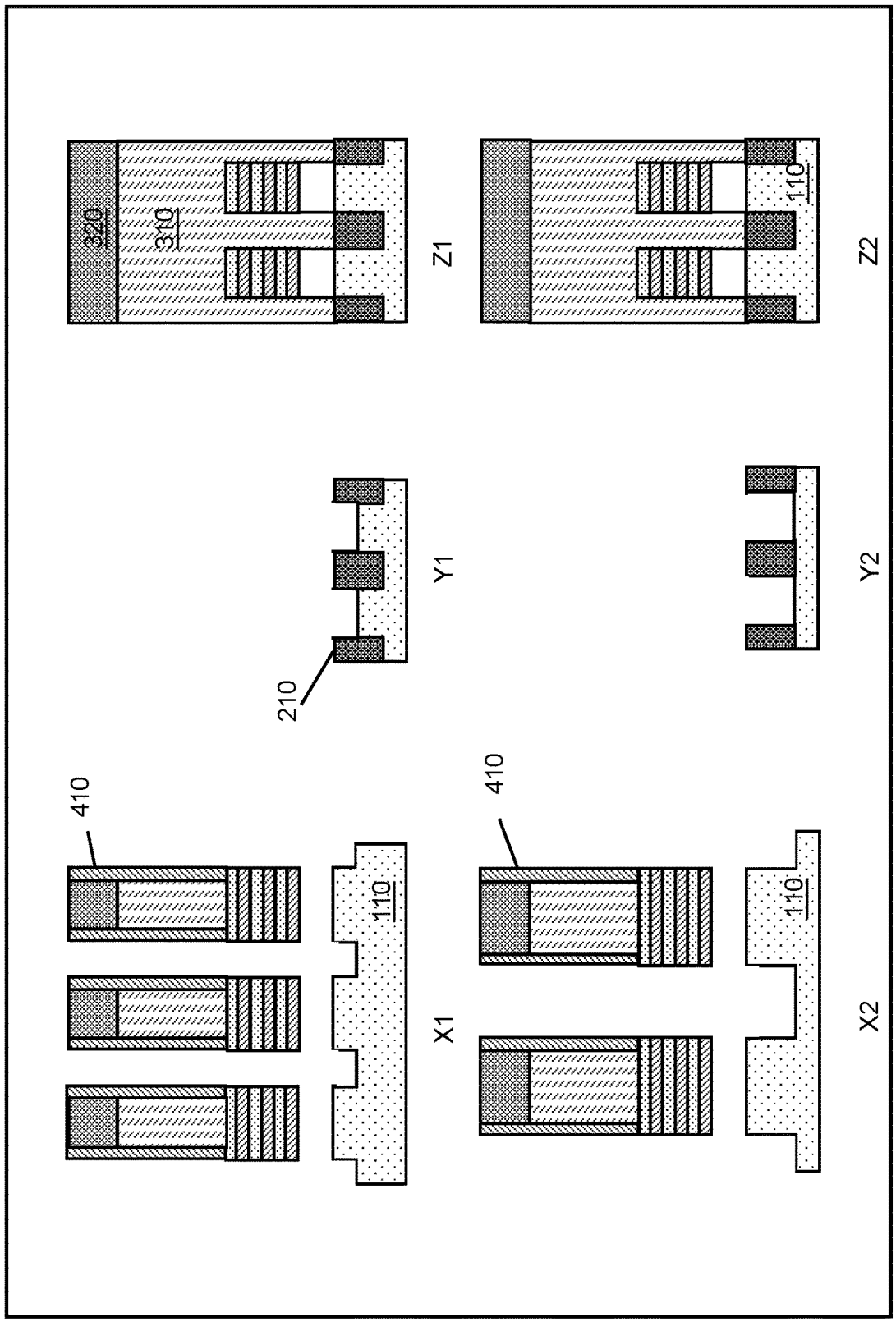
FIG. 6 provides cross sectional views of a step in the fabrication of a semiconductor device, according to an embodiment of the invention. The figure illustrates the device after the removal of a bottom sacrificial layer from the nanosheet stacks.

FIG. 6 illustrates the device following selective removal of the high Ge concentration sacrificial layer 120 from beneath the nanosheet stacks of the fins. Removal of the high Ge concentration sacrificial layer forms a continuous void space beneath the dummy gate structures of the device, connecting the recesses into the substrate in the gate canyons.

Figure 7:
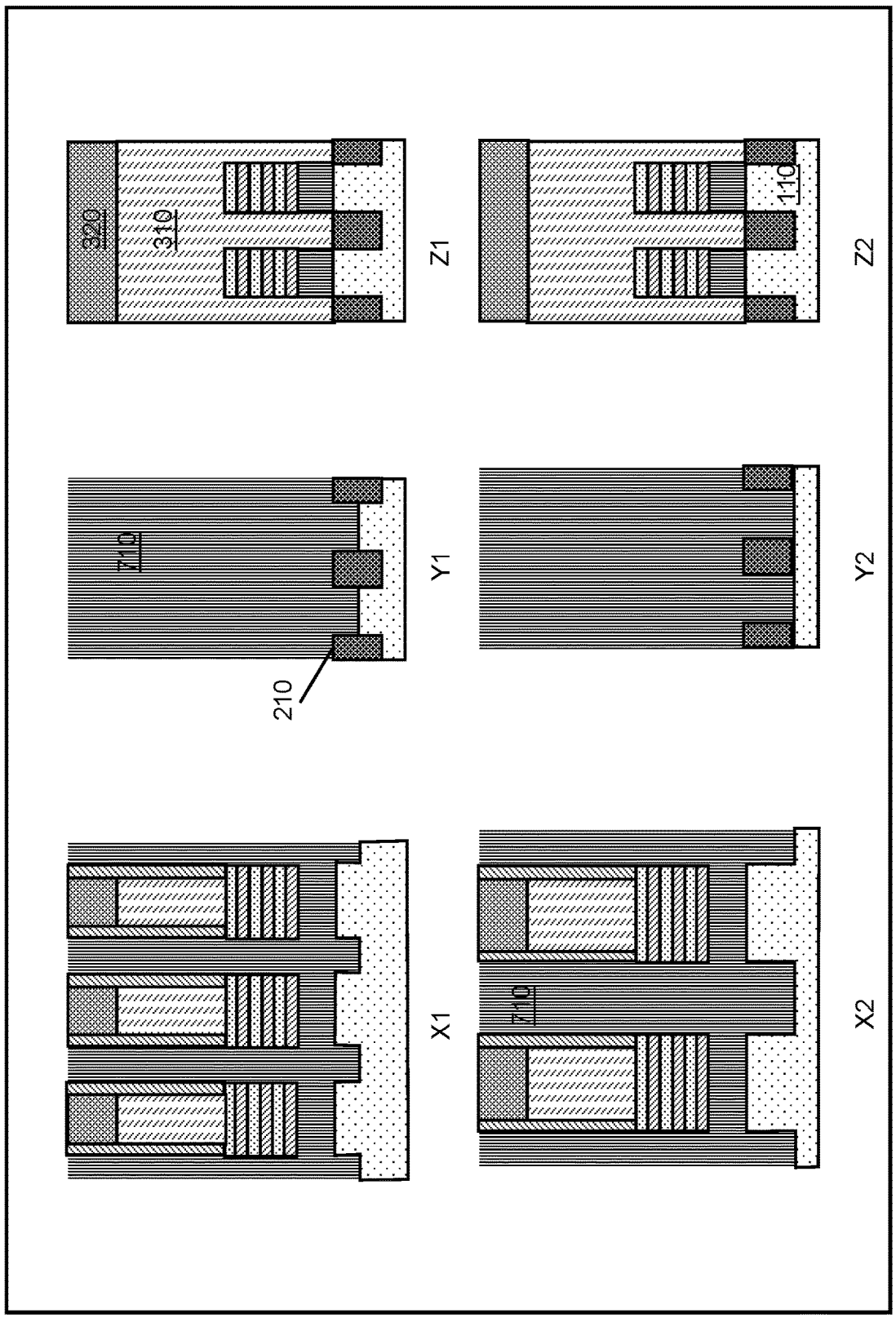
FIG. 7 provides cross sectional views of a step in the fabrication of a semiconductor device, according to an embodiment of the invention. The figure illustrates the device after the deposition of flowable BDI materials.

FIG. 7 illustrates the device following flowable chemical vapor deposition of a flowable dielectric material such as a flowable silicon oxide material, or materials including SiOC, SiON, SiOCN, or similar materials. Deposition of the dielectric proceeds until the gate canyons fill. CMP follows deposition to recess and polish the dielectric upper surface.

Figure 8:
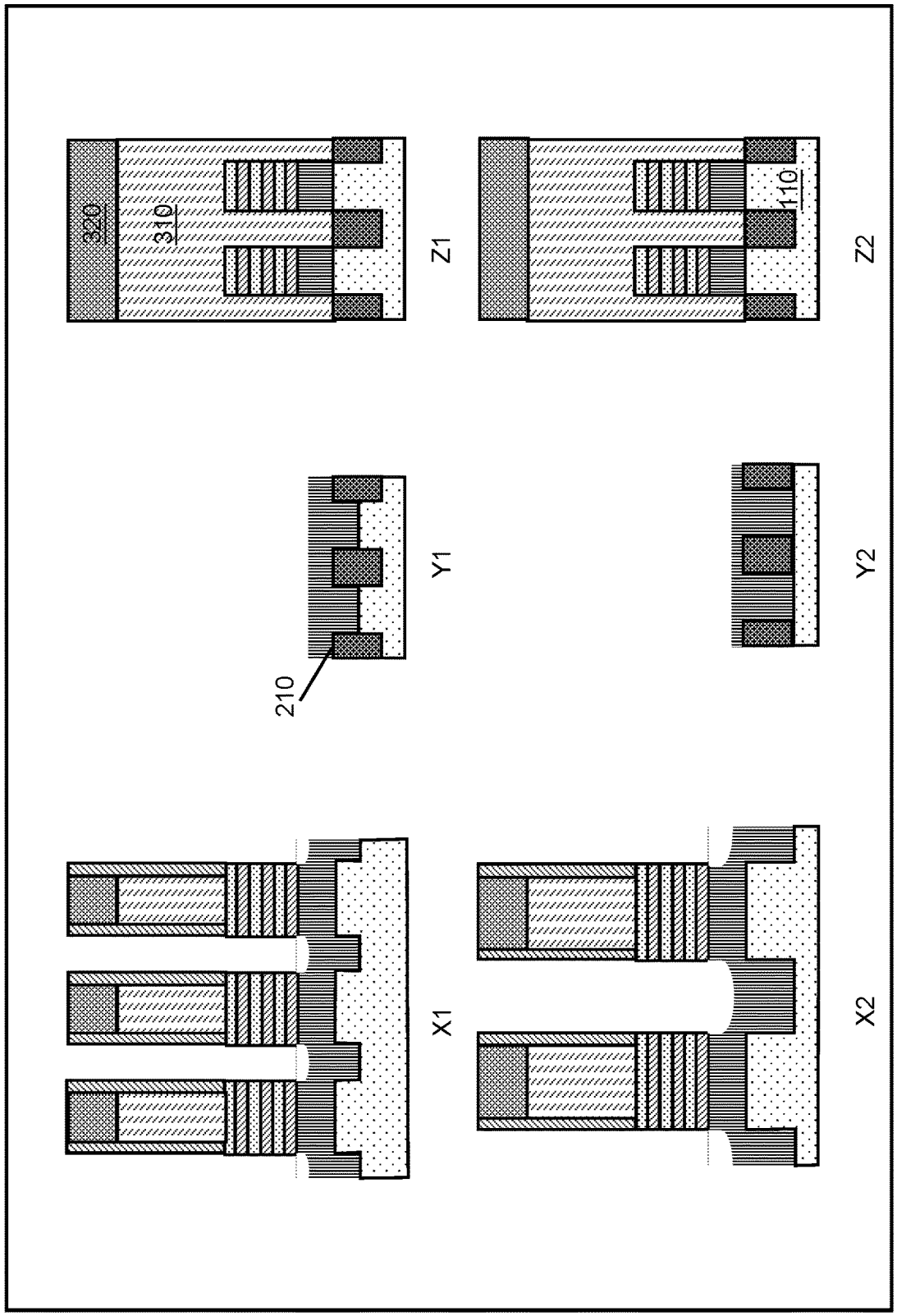
FIG. 8 provides cross sectional views of a step in the fabrication of a semiconductor device, according to an embodiment of the invention. The figure illustrates the device after the removal of excess BDI material.

FIG. 8 illustrates the device following selective recessing of the dielectric 710, clearing the material from the gate canyons to a desired level for the bottom dielectric layer. In an embodiment, the recessing proceeds beyond the upper surface of the bottom dielectric layer disposed beneath the gate structures. Recessing the dielectric yield a continuous bottom dielectric having a varying thickness. In an embodiment, the BDI thickness beneath the gate structures differs from the thickness beneath the gate canyons. Further, the BDI thickness beneath the gate canyons varies as a function of the gate canyon spacing, larger gate canyon spacings yield deeper BDI recesses. The BDI thickness beneath the gate canyons includes BDI material disposed in recesses formed in substrate 110.

Figure 9:
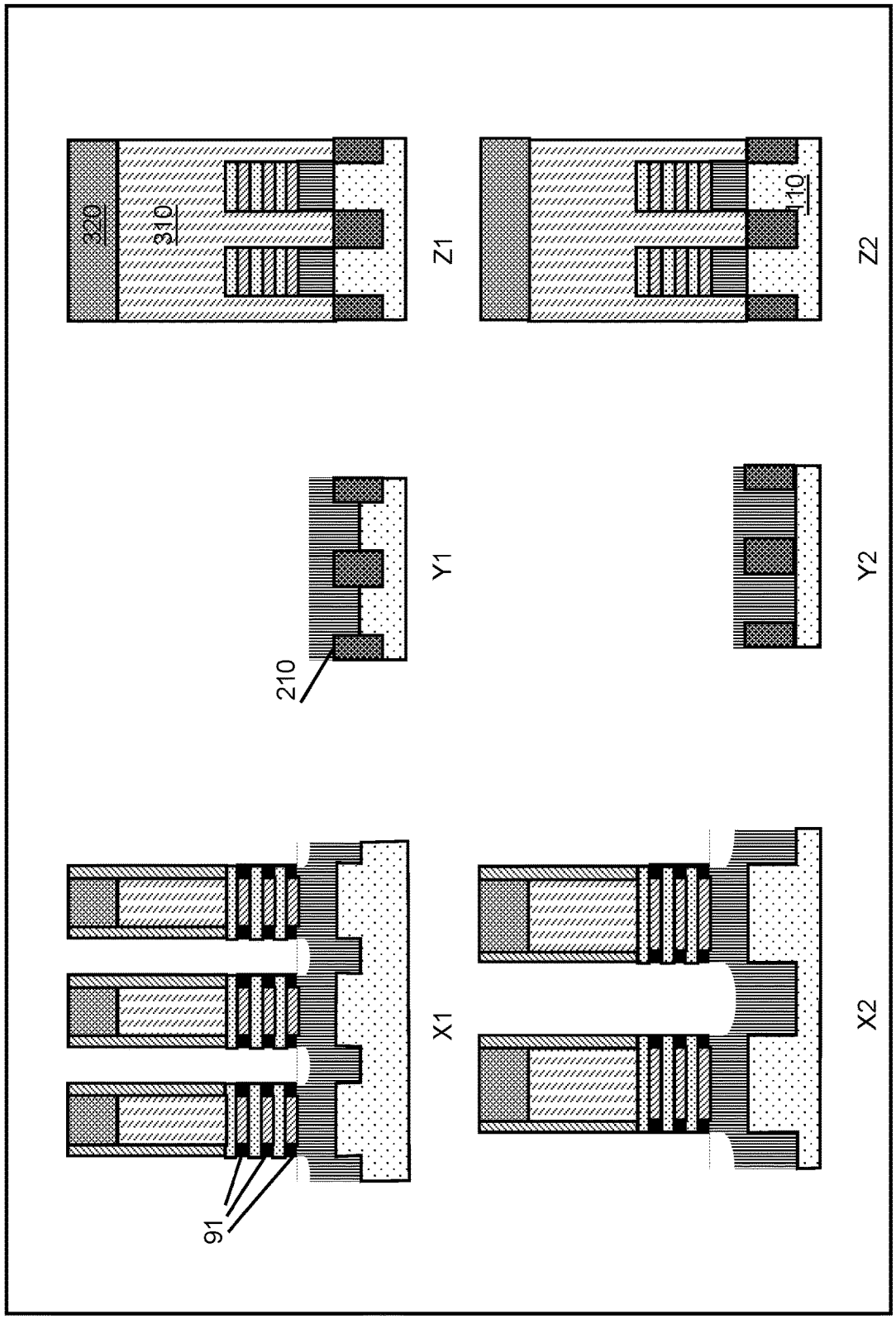
FIG. 9 provides cross sectional views of a step in the fabrication of a semiconductor device, according to an embodiment of the invention. The figure illustrates the device after the formation of inner spacers between otherwise adjacent nanosheets.

FIG. 9 illustrates the device following formation of dielectric inner spacers 910 between otherwise adjacent semiconductor nanosheets 130. A selective etching of SiGe layers 140 of the nanosheet stack removes portions of the layers which are underneath gate sidewall spacers 410. Inner spacers are then formed in etched portions and thus are located under gate sidewall spacers 410. Inner spacers can be composed of any suitable dielectric material, for example $Si_3N_4$, SiBCN, SiNC, SiN, SiCO, $SiO_2$, SiNOC, etc. The inner spacer is formed from a conformal dielectric liner 910 deposition filling the cavities and generally coating all exposed device surfaces. Subsequent to deposition of the inner spacer material, selective etching removes all extra material leaving only the inner spacers.

Figure 10:
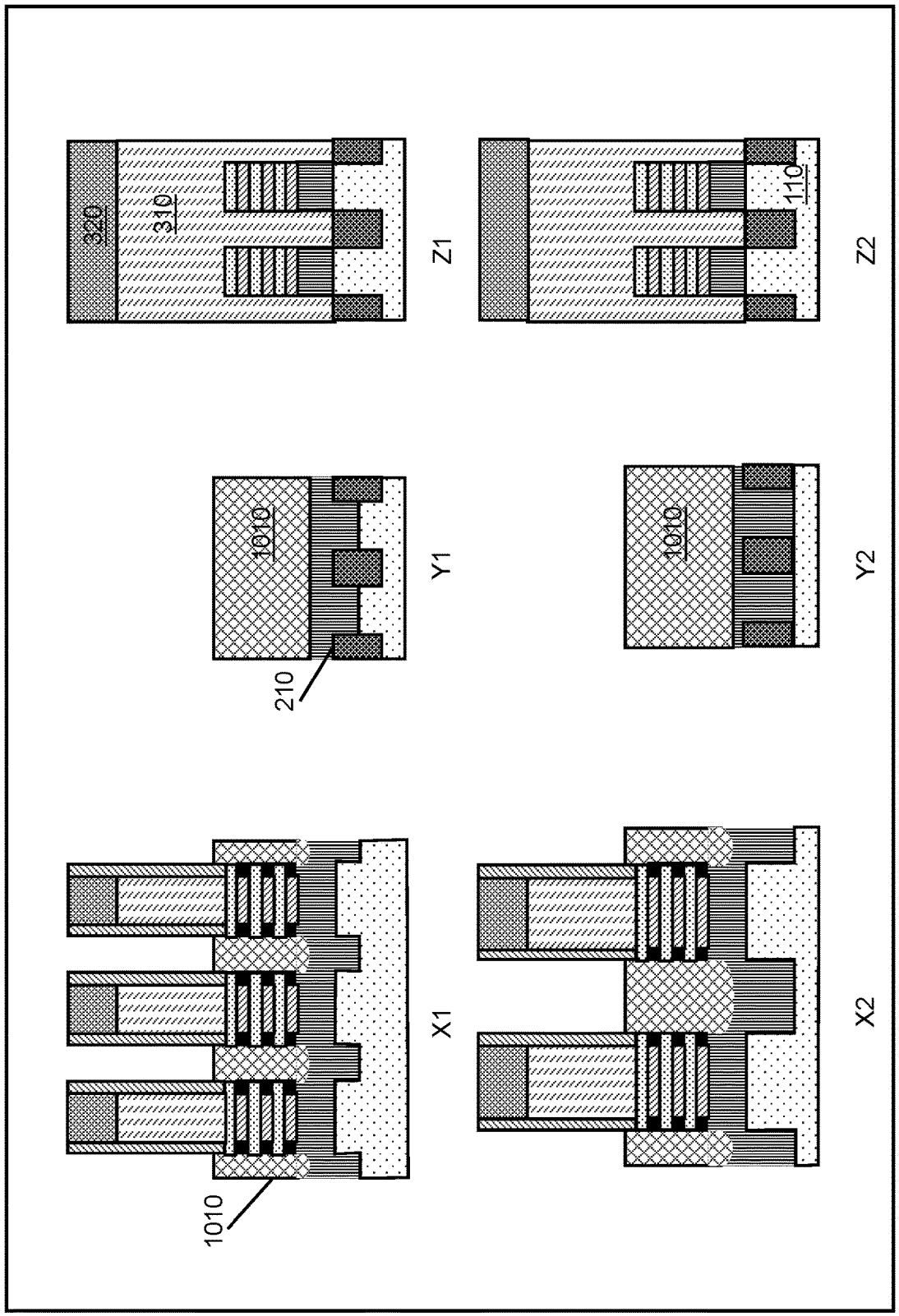
FIG. 10 provides cross sectional views of a step in the fabrication of a semiconductor device, according to an embodiment of the invention. The figure illustrates the device after the epitaxial growth of device source/drain regions.

FIG. 10 illustrates the device following the epitaxial growth of device source/drain (S/D) regions 1010, in the gate canyons. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 1010 may be doped in situ by adding one or more dopant species to the epitaxial material. The dopant used will depend on the type of FET being formed, whether p-type or n-type. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. Exemplaire n-type materials include Si:P, Si:As, Si:Sb, etc. In a silicon-containing semiconductor, examples of p-type dopants, i.e., impurities, include but are not limited to: boron, aluminum, gallium and indium. Exemplary p-type source materials include SiGe:B, SiGe:Ga, etc.

Figure 11:
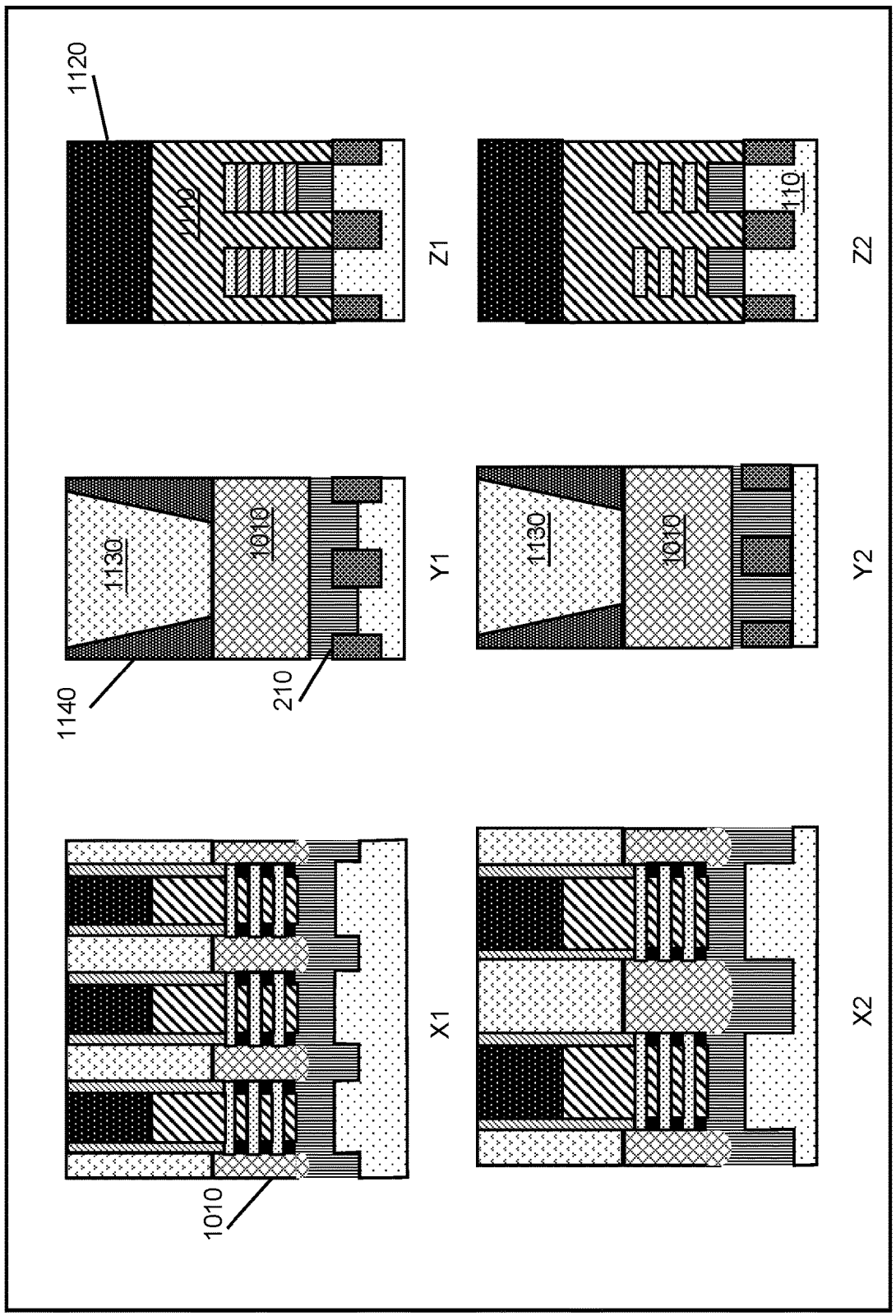
FIG. 11 provides cross sectional views of a step in the fabrication of a semiconductor device, according to an embodiment of the invention. The figure illustrates the device after the formation of high-k metal gates and source/drain metal contacts.

FIG. 11 illustrates the device following the removal of dummy gate 310, sacrificial SiGe 140, and formation of the high-k metal gate (HKMG) stack 1110. As shown in the Figure, a replacement metal gate structure has been formed in the void space created by removal of the dummy gate 310, and sacrificial SiGe 140. Gate structure 1110 includes gate dielectric and gate metal layers (not shown). The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a chemical mechanical planarization (CMP) process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by a deposition and CMP of a gate cap dielectric material 1120, such as SiN, or similar materials, completing the replacement metal gate fabrication stage for the device.

FIG. 11 further illustrates the device following formation of source/drain contacts 1130 through an interlayer dielectric encapsulation layer 1140. A trench metal contact process yields a metallized layer adjacent to and above the S-D region 1010. In an embodiment, formation of the trench metal layer 1130 includes forming a silicide layer between contact and epitaxial grown S/D regions 1010 (e.g., Ni silicide, Ti silicide, NiPt silicide, Co silicide, etc.) followed by forming metallization materials above the silicide (e.g., a thin adhesion metal such as TiN and a bulk metal fill such as Co, W, etc., followed by CMP.

Figure 12:
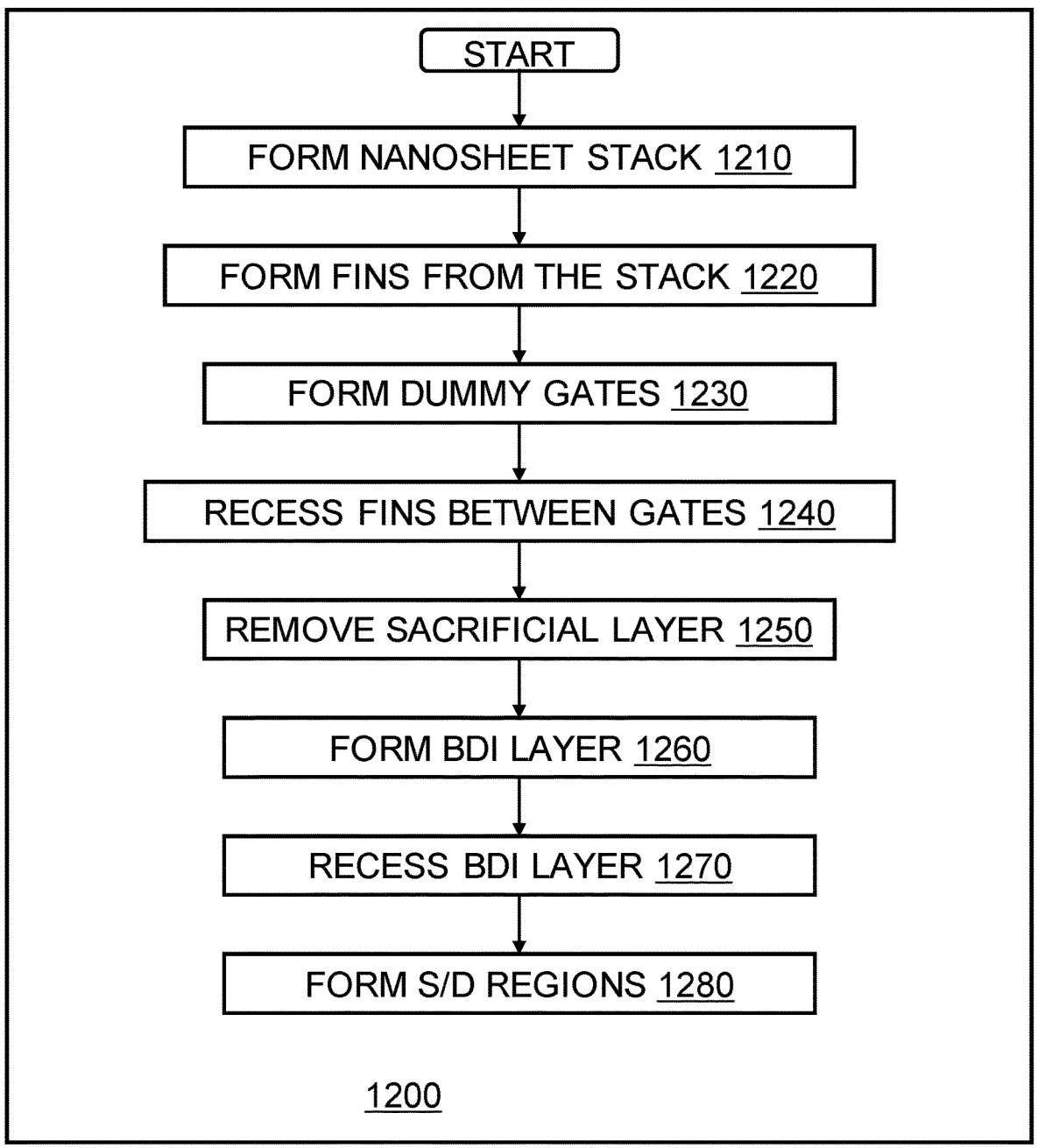
FIG. 12 provides a flowchart depicting operational steps for forming semiconductor device, according to an embodiment of the invention.

Flowchart 1200 of FIG. 12 depicts operational steps associated with semiconductor device fabrication, according to an embodiment of the invention. As shown in the Figure, at block 1210, a method to form a nanosheet stack upon a substrate. The nanosheet stack includes one or more sacrificial layers, including a bottom sacrificial layer separating the remaining layers on the stack from the substrate. This bottom sacrificial layer differs from the other sacrificial layers of the stack, for example by having a higher Ge concentration, and may be selectively removed without disturbing other stack layers.

At block 1220, the method forms device fins from the nanosheet stack through lithographic masking and selective etching of the nanosheet stack to the upper surface of the underlying substrate. Each fin includes portions of each layer of the nanosheet stack.

At block 1230, the method forms dummy gate structures upon the device fins. The dummy gate structures include a dummy gate element protected by an upper hard mask and protective sidewall spacers defining the gate length of the device. The dummy gate spacing may vary according to the portion of the overall device such that different device portions have differing gate canyon spacings.

At block 1240, the method recesses the fins between otherwise adjacent dummy gates. Recessing the fins creates source/drain spaces and proceeds into the underlying substrate. The depth of the recess into the underlying substrate is directly proportional to the local gate canyon spacing length for each portion of the device.

At block 1250, the method removes the bottom sacrificial layer of each device fin through a selective etch tuned to the bottom sacrificial layer material. This removal creates a void space beneath the remaining nanosheet stack layers.

At block 1260 the method forms the bottom dielectric isolation layer through deposition of a dielectric such as a flowable dielectric, into the void space created beneath the gates and in the recesses formed in the substrate.

At block 1270, the method recesses the bottom dielectric layer between gate structures through a selective etching. The depth of the recess is determined by the local gate spacing length. Etching yields deeper recesses between gates having wider spacing.

At block 1280, the method forms S/D regions between gates. The S/D regions may be epitaxially grown from exposed edges of gate structure nanosheets and trimmed back as desired.

Additional fabrication steps including the formation of inner spacers between otherwise adjacent nanosheets, the formation of high-k metal gates in place of the dummy gates, and the formation of device source/drain and gate contacts may also be part of the fabrication methods.

FIG. 13-23 relate to an alternative device structure. This alternative structure includes bottom dielectric isolation beneath source/drain regions but lacks a continuous bottom dielectric isolation layer.

Figure 13:
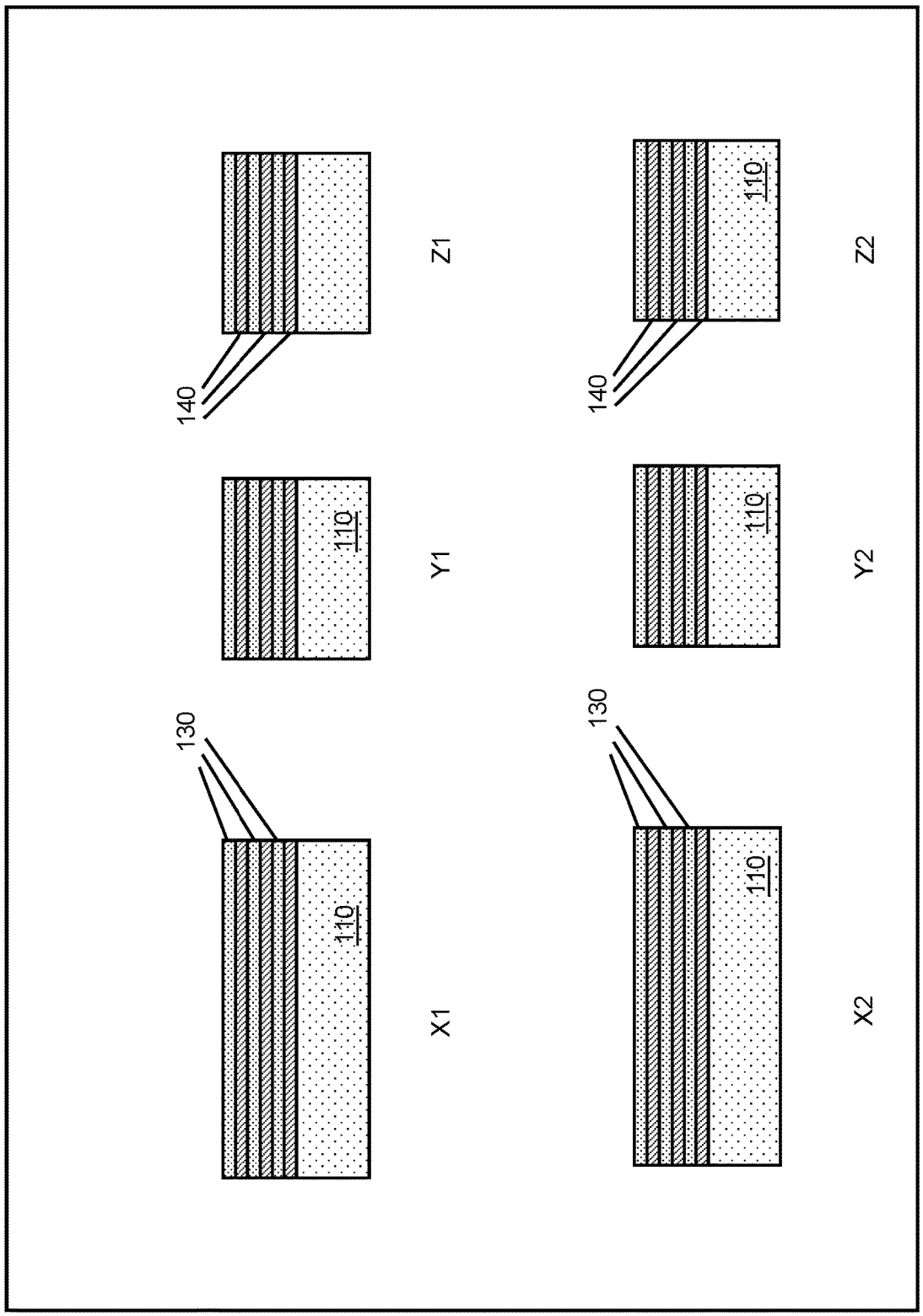
FIG. 13 provides cross sectional views of a step in the fabrication of a semiconductor device, according to an embodiment of the invention. The figure illustrates a formed stack of alternating nanosheet upon a substrate.

FIG. 13 provides schematic views of a device according to an embodiment of the invention following the deposition of a stack of layers for the formation of FET device nanosheets. In an embodiment, the stack includes alternating layers of epitaxially grown silicon germanium 140 and silicon 130. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The nanosheet stack includes a bottom-most layer of a first semiconductor material, such as SiGe, and alternating layers of a second semiconductor material, such as Si. The nanosheet stack is depicted with six layers (three SiGe layers and three Si layers forming a device. However, any number and combination of layers can be used so long as the layers alternate between SiGe and Si to form a device. The nanosheet stack is depicted with the layers being in the form of nanosheets, however the width of any given nanosheet layer can be varied so as to result in the form of a nanowire, a nanowire, etc. SiGe layers 140, can be composed of, for instance, $SiGe_{15-35}$, examples thereof including, but not limited to $SiGe_{15}$, $SiGe_{20}$, $SiGe_{25}$ . . . $SiGe_{35}$.

Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

In an embodiment, each sacrificial semiconductor material layer 140, is composed of a first semiconductor material which differs in composition from at least an upper portion of the semiconductor substrate 110. In one embodiment, the upper portion of the semiconductor substrate 110 is composed of silicon, while each sacrificial semiconductor material layers 140 is composed of a silicon germanium alloy. In such an embodiment, the SiGe alloy that provides each sacrificial semiconductor material layer 140 has a germanium content that is less than 45 atomic percent germanium. In one example, the SiGe alloy that provides each sacrificial semiconductor material layer 140 has a germanium content from 15 atomic percent germanium to 35 atomic percent germanium. The first semiconductor material that provides each sacrificial semiconductor material layers 140 can be formed utilizing an epitaxial growth (or deposition process).

Each semiconductor channel material layer 130, is composed of a second semiconductor material that has a different etch rate than the first semiconductor material of the sacrificial semiconductor material layers 140 and is also resistant to Ge condensation. The second semiconductor material of each semiconductor channel material layer 130, may be the same as, or different from, the semiconductor material of at least the upper portion of the semiconductor substrate 110. The second semiconductor material can be a SiGe alloy provided that the SiGe alloy has a germanium content that is less than 45 atomic percent germanium, and that the first semiconductor material is different from the second semiconductor material.

In one example, at least the upper portion of the semiconductor substrate 110 and each semiconductor channel material layer 130 is composed of Si or a III-V compound semiconductor, while each sacrificial semiconductor material layer 140 is composed of a silicon germanium alloy. The second semiconductor material of each semiconductor channel material layer 130, can be formed utilizing an epitaxial growth (or deposition process).

Figure 14:
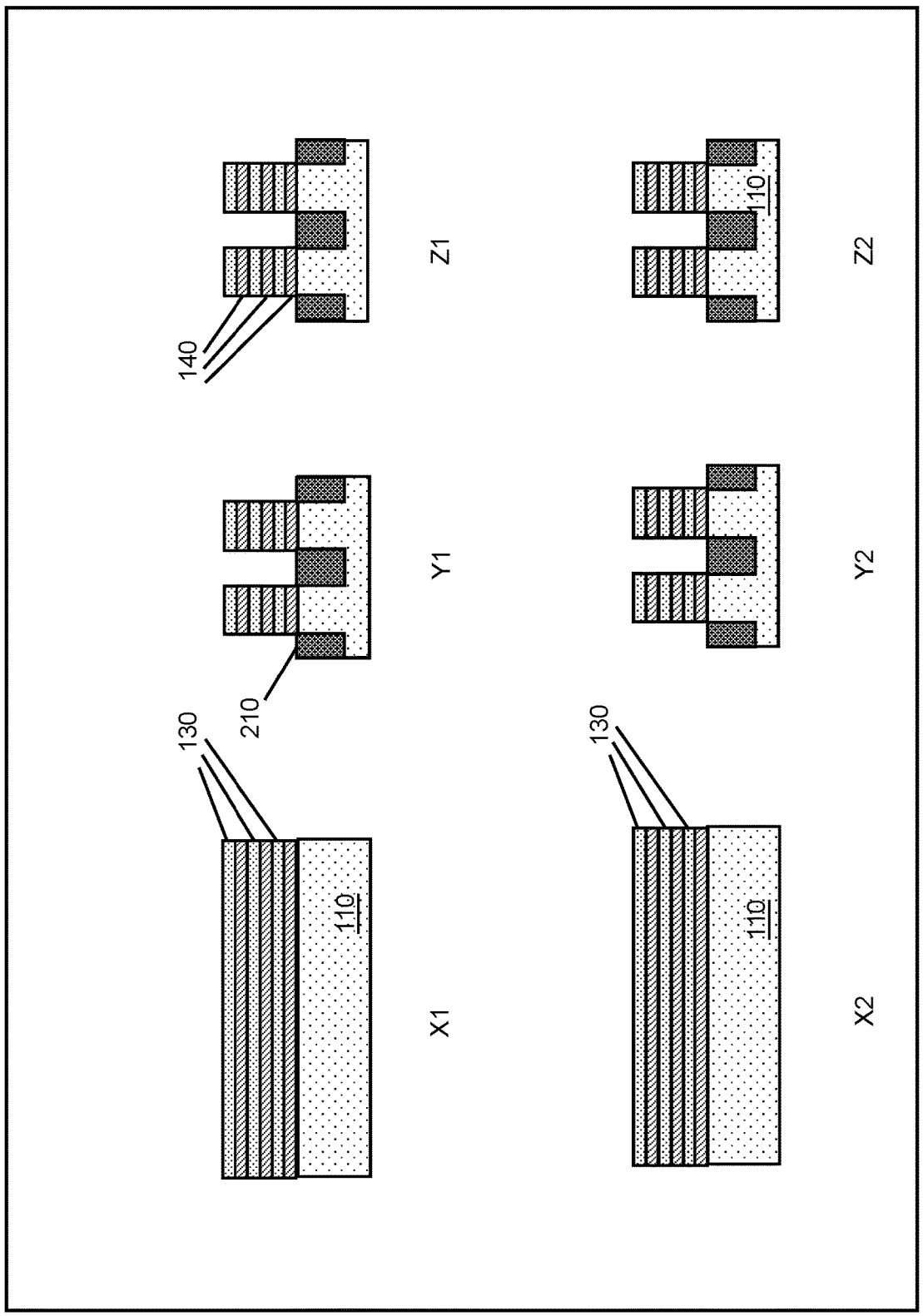
FIG. 14 provides cross sectional views of a step in the fabrication of a semiconductor device, according to an embodiment of the invention. The figure illustrates the device after the formation of device fins from the nanosheet stack and deposition of shallow trench isolation materials.

As shown in FIG. 14, fabrication of the device proceeds with the patterning, masking and selective etching of the stack of nanosheet layers to form individual nanosheet fin stacks. In an embodiment, the stack includes alternating layers of epitaxially grown silicon germanium 140, and silicon 130. Other materials having similar properties may be used in place of the SiGe and Si. In an embodiment, reactive ion etching recesses exposed nanosheet stack portions yielding the desired nanosheet stack fins.

In an embodiment, the etching proceeds into substrate 110. Deposition of a shallow trench isolation (STI) material 210, such as silicon dioxide, or any suitable combination of multiple dielectric materials (e.g., silicon nitride and silicon oxide), occurs after the formation of shallow trench isolation (STI) regions between nanosheet stack circuit elements of the device. Following such deposition, chemical mechanical planarization (CMP) processes smooth the upper surface of the deposited oxide in preparation for the subsequent fabrication steps. An oxide recess process trims the upper surface of STI regions to the level of the bottom sacrificial semiconductor layer 140. STI regions 210 provide electrical isolation between adjacent NS devices.

Figure 15:
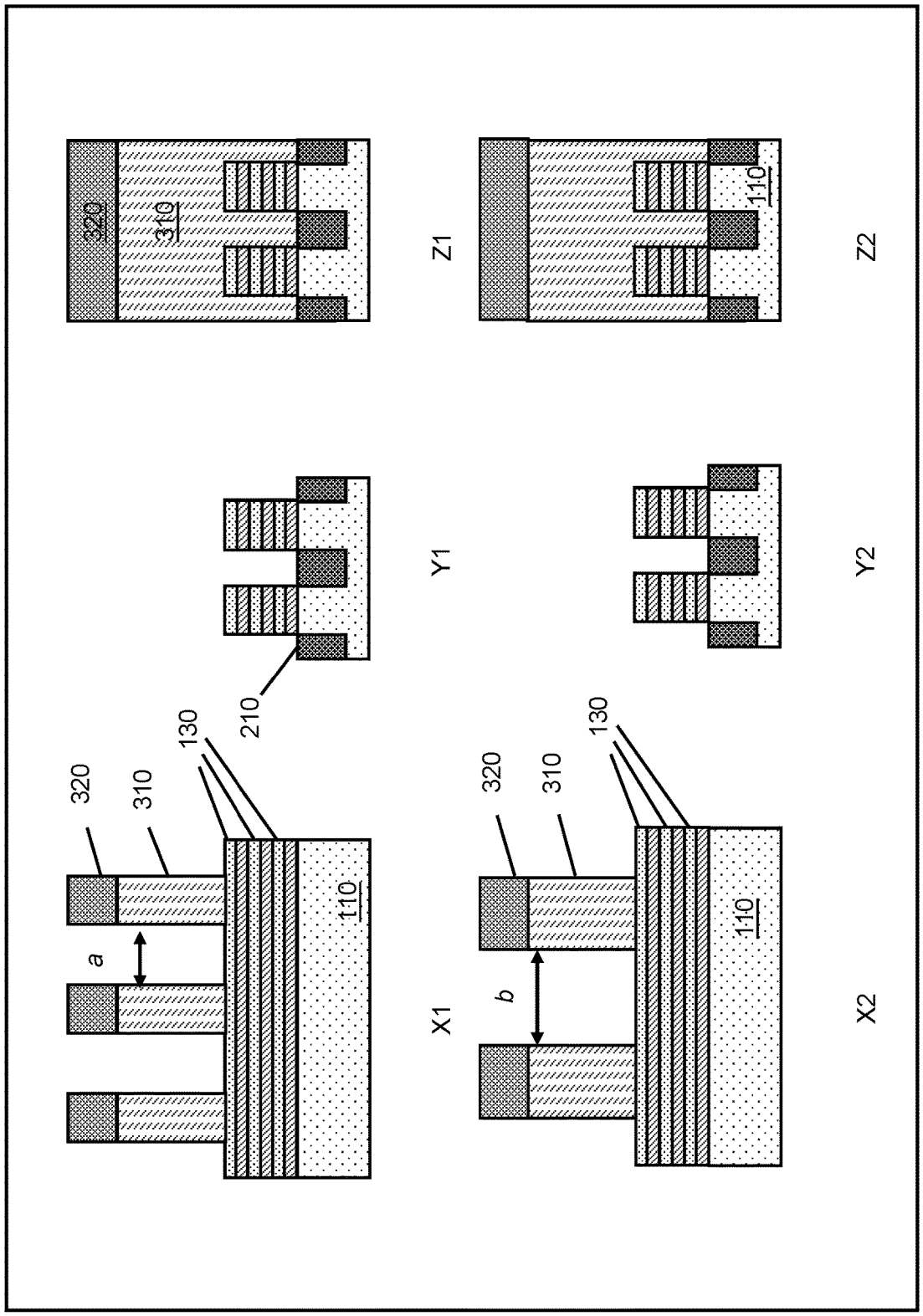
FIG. 15 provides cross sectional views of a step in the fabrication of a semiconductor device, according to an embodiment of the invention. The figure illustrates the device after the formation of dummy gate structures.

FIG. 15 illustrates the device following the forming of at least one dummy gate structure on the nanosheet stack. Two dummy gates are shown however any number of gates can be formed. Different portions of a single device may comprise gate elements having differing gate length—the spacing between adjacent gate structures. Dummy gate structures can be formed by depositing a dummy gate material 310 over the nanosheet stack. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The dummy gate material 310 can be, for example, a thin layer of oxide, followed by polycrystalline silicon, amorphous silicon or microcrystal silicon. After that, a hardmask layer 320 is deposited over the dummy gate, followed by lithographic patterning and masking and selective etching processes.

Hard mask 320 includes a nitride, oxide, an oxide-nitride bilayer, or another suitable material. In some embodiments, the hardmask 320 may include an oxide such as silicon oxide (SiO), a nitride such as silicon nitride (SiN), an oxynitride such as silicon oxynitride (SiON), combinations thereof, etc. In some embodiments, the hardmask 320 is a silicon nitride such as $Si_3N_4$.

Figure 16:
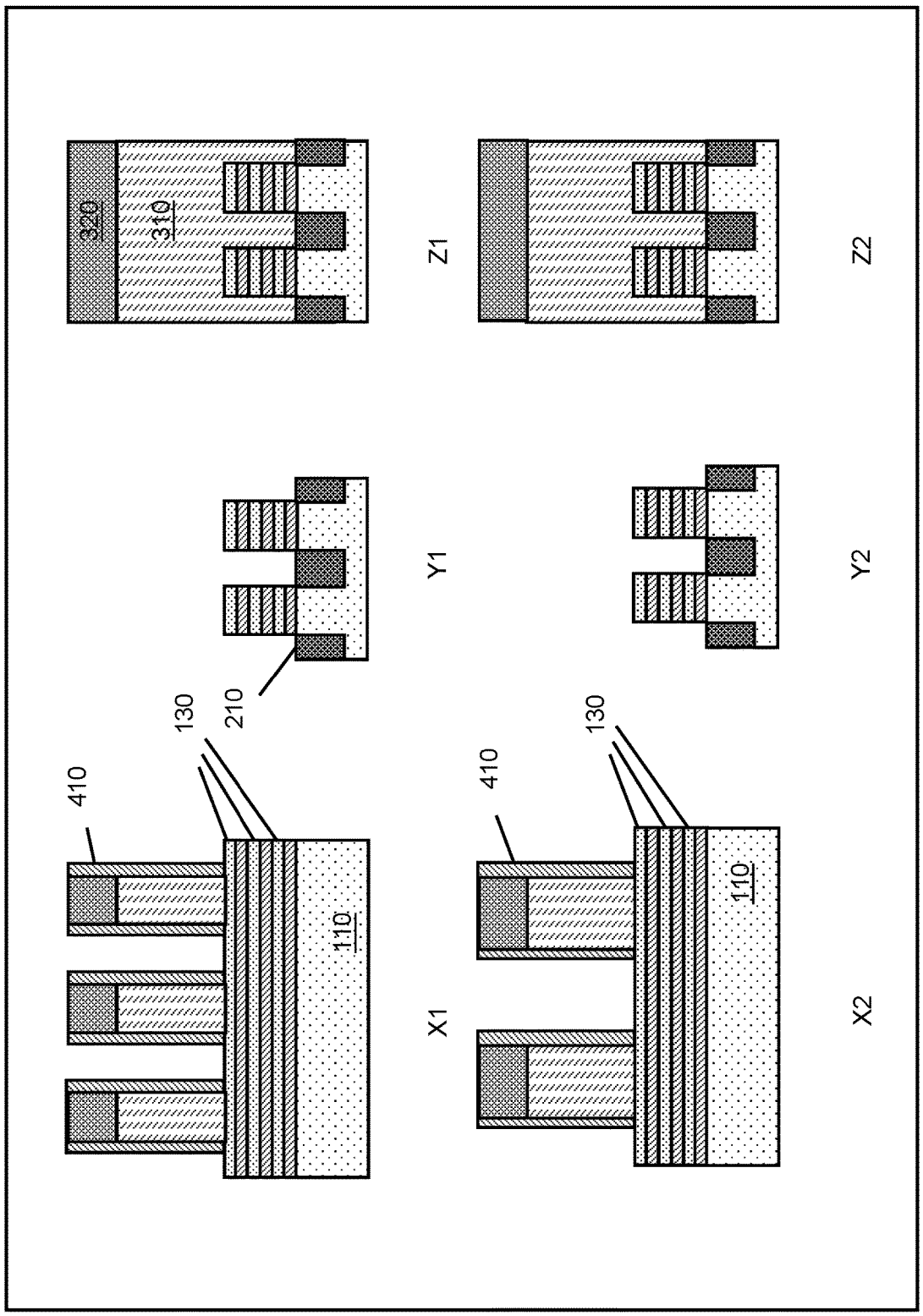
FIG. 16 provides cross sectional views, of a step in the fabrication of a semiconductor device, according to an embodiment of the invention. The figure illustrates the device after the formation of gate sidewall spacers.

FIG. 16 illustrates a device following the deposition and subsequent etching, such as anisotropic etching to remove material from horizontal surfaces, of gate sidewall spacers 410 adjacent to the vertical surfaces of dummy gate materials 310 and hardmask 320. In an embodiment, gate sidewall material 410, may be the same material as hardmask 320, or may be different materials and may be comprised of any one or more of a variety of different insulative materials, such as $Si_3N_4$, SiBCN, SiNC, SiN, SiCO, $SiO_2$, SiNOC, etc. In this embodiment, after conformal deposition, selective etching, such as anisotropic reactive ion etching, removes gate sidewall spacer material 410 from horizontal surfaces of the intermediate stage of the device.

Figure 17:
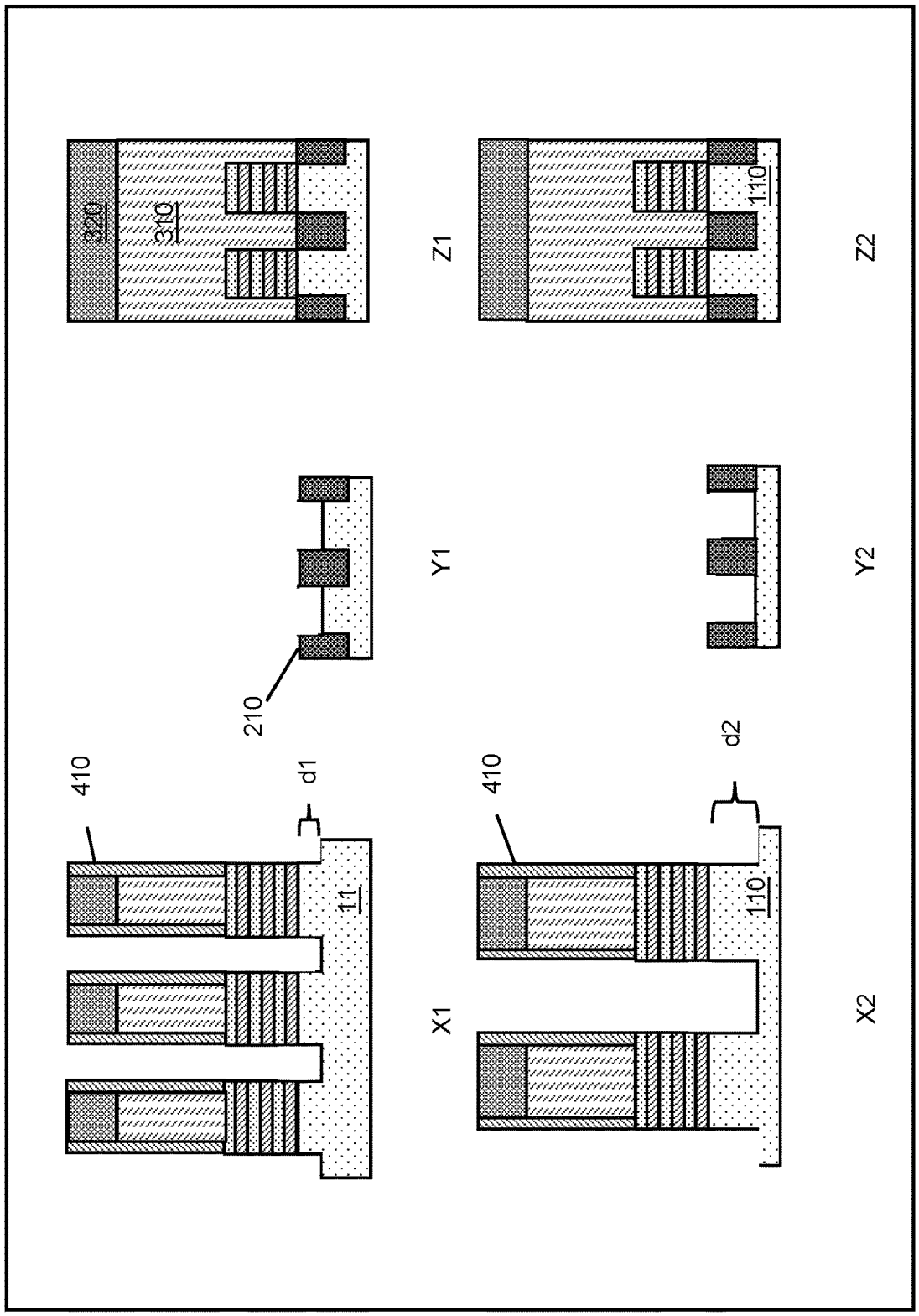
FIG. 17 provides cross sectional views of a step in the fabrication of a semiconductor device, according to an embodiment of the invention. The figure illustrates the device after recessing the fins between adjacent dummy gates.

FIG. 17 illustrates a device following the selective masking and etching of nanosheets between dummy gate structures, yielding individual gate structures. Selective anisotropic etching such as RIE removes portions of the alternating sacrificial layers 140 and channel layers 130 from between adjacent dummy gate structures as well as upper portions of substrate 110. Protective gate sidewall spacers 410 prevent damage to the dummy gate structures. The nanosheet layer portions are removed to a level beyond the upper surface of the substrate 110. The depth of the recess relates directly to the width of the gate canyon between otherwise adjacent gate structures. Deeper recesses form between more widely separated gates than those between narrowly separated gates. As shown in the Figure, recess d2 into substrate 110 exceeds the depth of recess d1 into substrate 110 due to the larger relative width of the gate canyon b to gate canyon a. As a<b, d1<d2.

Figure 18:
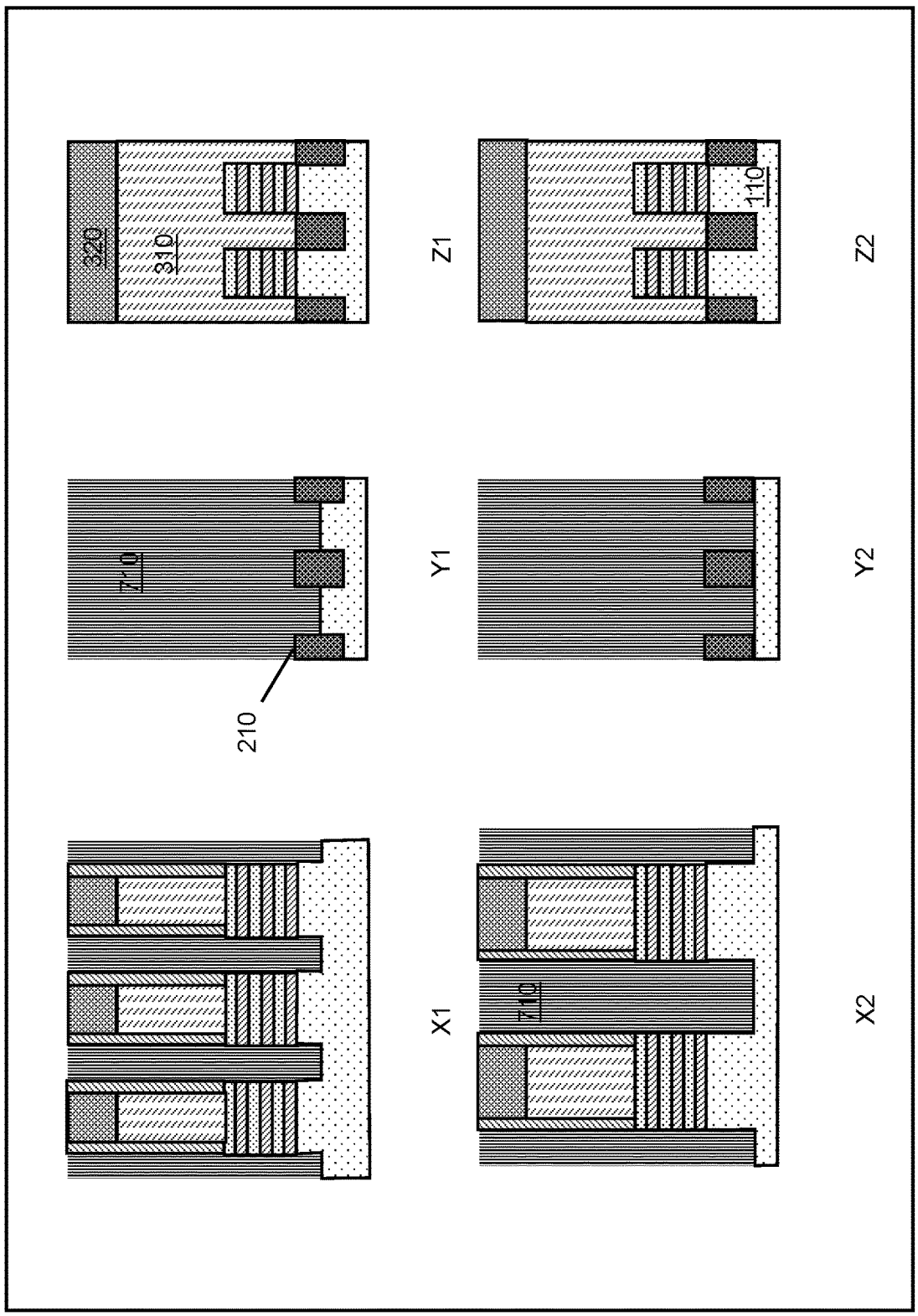
FIG. 18 provides cross sectional views of a step in the fabrication of a semiconductor device, according to an embodiment of the invention. The figure illustrates the device after the deposition of flowable BDI materials.

FIG. 18 illustrates the device following flowable chemical vapor deposition of a flowable dielectric material 710, such as a flowable silicon oxide material, such as a flowable silicon oxide material, or materials including SiOC, SiON, SiOCN, or similar materials. Deposition of the dielectric proceeds until the gate canyons fill. CMP follows deposition to recess and polish the dielectric upper surface.

Figure 19:
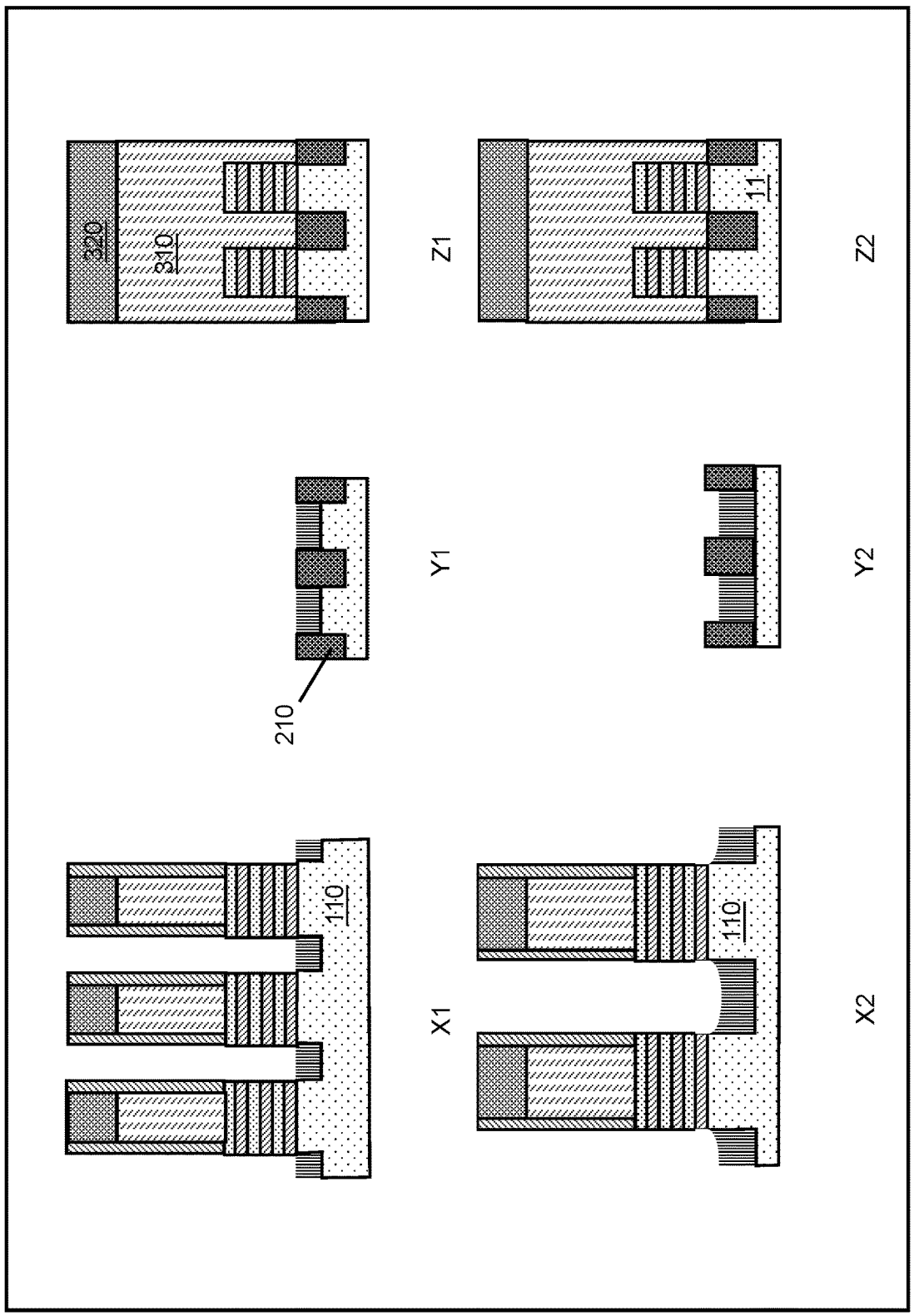
FIG. 19 provides cross sectional views of a step in the fabrication of a semiconductor device, according to an embodiment of the invention. The figure illustrates the device after the removal of excess BDI material.

FIG. 19 illustrates the device following selective recessing of the dielectric 710, clearing the material from the gate canyons to a desired level for the bottom dielectric layer. In an embodiment, the recessing proceeds beyond the upper surface of the substrate 110, disposed beneath the gate structures. In an embodiment, the BDI thickness beneath the gate canyons varies as a function of gate canyon spacing. The BDI thickness beneath a gate canyon includes BDI material disposed in recesses formed in substrate 110.

Figure 20:
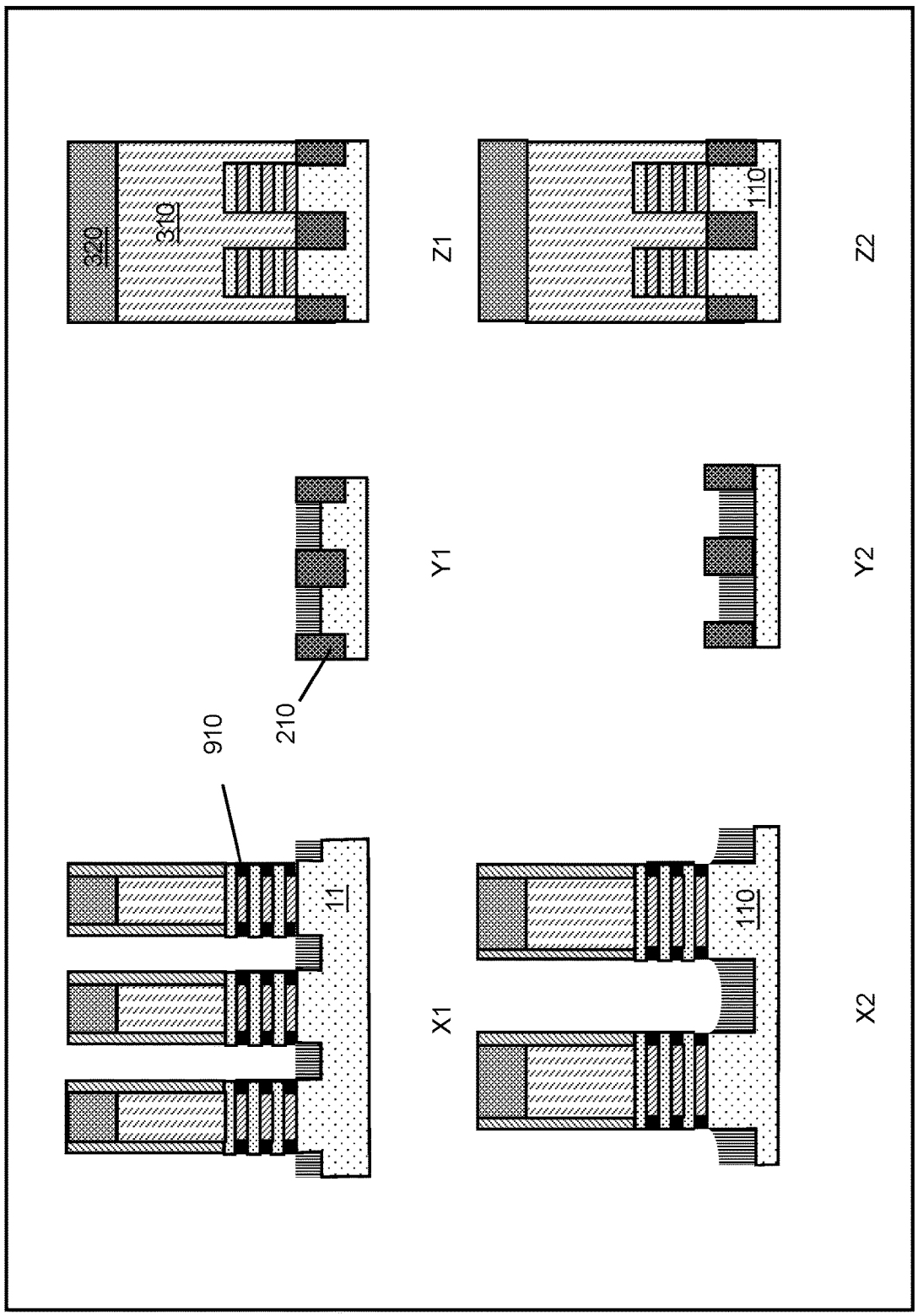
FIG. 20 provides cross sectional views of a step in the fabrication of a semiconductor device, according to an embodiment of the invention. The figure illustrates the device after the formation of inner spacers between otherwise adjacent nanosheets.

FIG. 20 illustrates the device following formation of dielectric inner spacers 910, between otherwise adjacent semiconductor nanosheets 130. A selective etching of SiGe layers 140 of the nanosheet stack removes portions of the layers which are underneath gate sidewall spacers 410. Inner spacers are then formed in etched portions and thus are located under gate sidewall spacers 410. Inner spacers can be composed of any suitable dielectric material, for example $Si_3N_4$, SiBCN, SiNC, SiN, SiCO, $SiO_2$, SiNOC, etc. The inner spacer 910, is formed from a conformal dielectric liner 910 deposition filling the cavities and generally coating all exposed device surfaces. Subsequent to deposition of the inner spacer material, selective etching removes all extra material leaving only the inner spacers.

Figure 21:
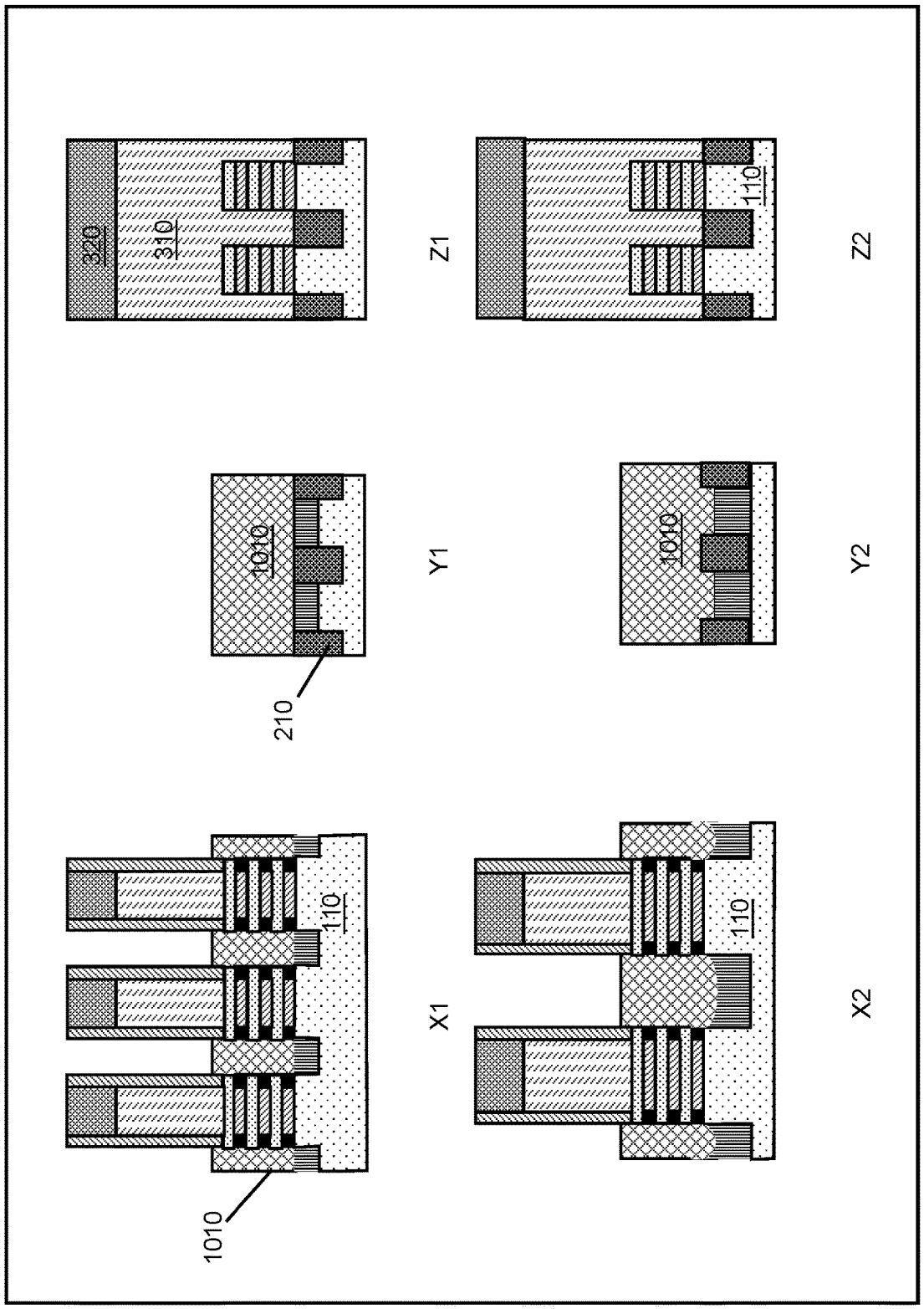
FIG. 21 provides cross sectional views of a step in the fabrication of a semiconductor device, according to an embodiment of the invention. The figure illustrates the device after the epitaxial growth of device source/drain regions.

FIG. 21 illustrates the device following the epitaxial growth of device source/drain (S/D) regions 1010, in the gate canyons. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 1010 may be doped in situ by adding one or more dopant species to the epitaxial material. The dopant used will depend on the type of FET being formed, whether p-type or n-type. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. Exemplary n-type materials include Si:P, Si:As, Si:Sb, etc. In a silicon-containing semiconductor, examples of p-type dopants, i.e., impurities, include but are not limited to: boron, aluminum, gallium and indium. Exemplary p-type source materials include SiGe:B, SiGe:Ga, etc.

Figure 22:
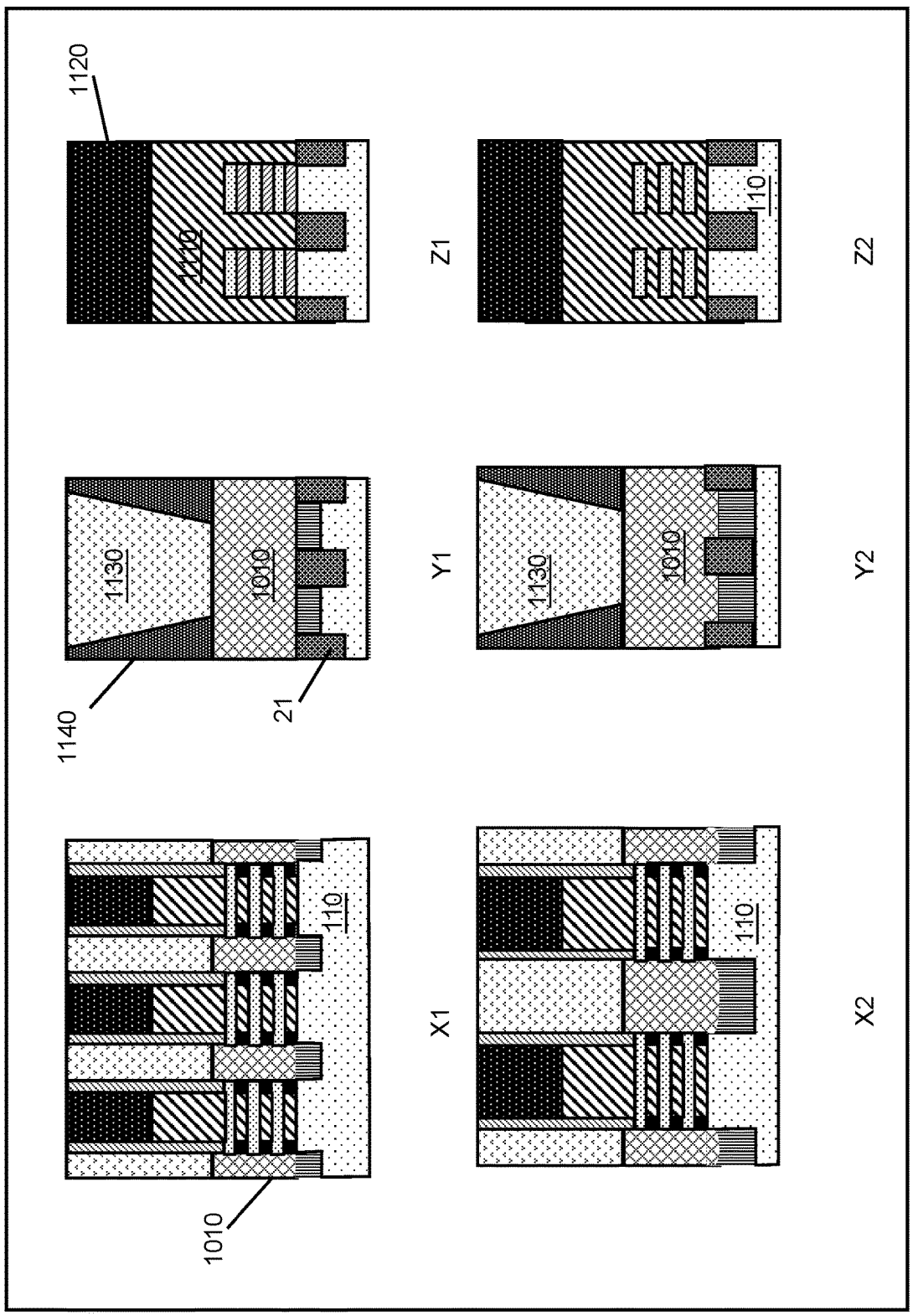
FIG. 22 provides cross sectional views of a step in the fabrication of a semiconductor device, according to an embodiment of the invention. The figure illustrates the device after the formation of high-k metal gates and source/drain metal contacts.

FIG. 22 illustrates the device following the removal of dummy gate 310, sacrificial SiGe 140, and formation of the high-k metal gate (HKMG) stack 1110. As shown in the Figure, a replacement metal gate structure has been formed in the void space created by removal of the dummy gate 310, and sacrificial SiGe 140. Gate structure 1110 includes gate dielectric and gate metal layers (not shown). The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a chemical mechanical planarization (CMP) process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by a deposition and CMP of a gate cap dielectric material 1120, such as SiN, or similar materials, completing the replacement metal gate fabrication stage for the device.

FIG. 22 further illustrates the device following formation of source/drain contacts 1130 through an interlayer dielectric layer 1140. A trench metal contact process yields a metallized layer adjacent to and above the S-D region 1010. In an embodiment, formation of the trench metal layer 1130 includes forming a silicide layer between contact and epitaxial grown S/D regions 1010 (e.g., Ni silicide, Ti silicide, NiPt silicide, Co silicide, etc.) followed by forming metallization materials above the silicide (e.g., a thin adhesion metal such as TiN and a bulk metal fill such as Co, W, etc., followed by CMP.

Figure 23:
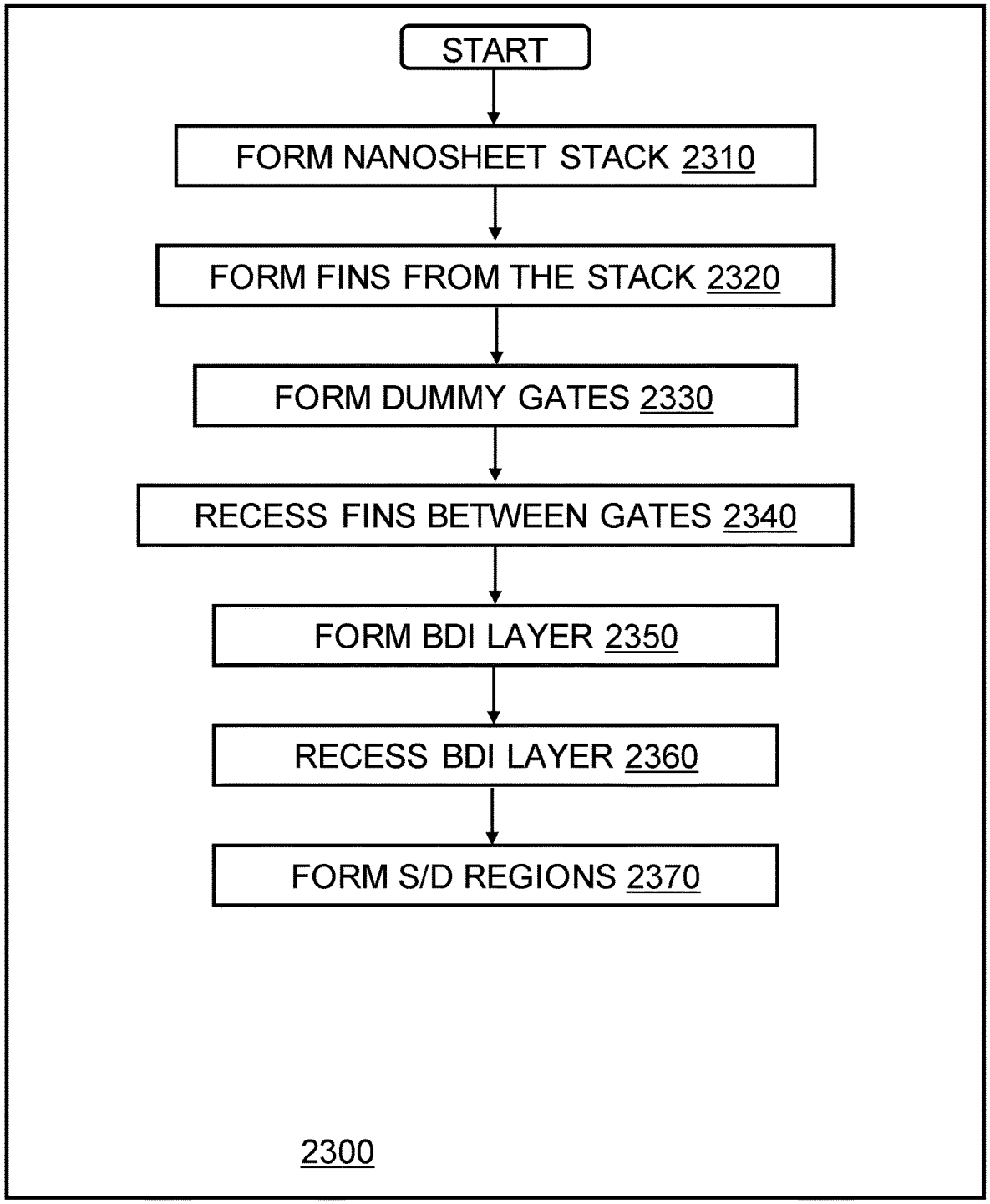
FIG. 23 provides a flowchart depicting operational steps for forming semiconductor device, according to an embodiment of the invention.

Flowchart 2300 of FIG. 23 depicts operational steps associated with semiconductor device fabrication, according to an embodiment of the invention. As shown in the Figure, at block 2310, a method form a nanosheet stack upon a substrate. The nanosheet stack includes one or more sacrificial layers as well as channel layers.

At block 2320, the method forms device fins from the nanosheet stack through lithographic masking and selective etching of the nanosheet stack to the upper surface of the underlying substrate. Each fin includes portions of each layer of the nanosheet stack.

At block 2330, the method forms dummy gate structures upon the device fins. The dummy gate structures include a dummy gate element protected by an upper hard mask and protective sidewall spacers defining the gate length of the device. The dummy gate spacing may vary according to the portion of the overall device such that different device portions have differing gate canyon spacings.

At block 2340, the method recesses the fins between otherwise adjacent dummy gates. Recessing the fins creates source/drain spaces and proceeds into the underlying substrate. The depth of the recess into the underlying substrate is directly proportional to the local gate canyon spacing for each portion of the device.

At block 2350 the method forms the bottom dielectric isolation layer through deposition of a dielectric such as a flowable dielectric, into the void space created between the gates.

At block 2360, the method recesses the bottom dielectric layer between gate structures through a selective etching. The depth of the recess is determined by the local gate canyon spacing length. Etching yields deeper recesses between gates having larger gate canyon spacing.

At block 2370, the method forms S/D regions between gates. The S/D regions may be epitaxially grown from exposed edges of gate structure nanosheets and trimmed back as desired.

Additional fabrication steps including the formation of inner spacers between otherwise adjacent nanosheets, the formation of high-k metal gates in place of the dummy gates, and the formation of device source/drain and gate contacts may also be part of the fabrication methods.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
    a semiconductor substrate;
    a first pair of FET (field effect transistor) gate structures separated by a first gate canyon having a first gate canyon spacing, disposed upon the substrate;
    a second pair of FET gate structures separated by a second gate canyon having a second gate canyon spacing, disposed upon the substrate;
    a first S/D (source/drain) region disposed in the first gate canyon;
    a second S/D region disposed in the second gate canyon;
    a first BDI (bottom dielectric isolation) element disposed below the first S/D region and having a first BDI thickness; and
    a second BDI element disposed below the second S/D region and having a second BDI thickness;
    wherein the first BDI thickness exceeds the second BDI thickness.

2. The semiconductor device according to claim 1, further comprising a first continuous BDI element below the first pair of FET gate structures and including the first BDI element.

3. The semiconductor device according to claim 2, wherein the first S/D region extends below an upper surface of the first continuous BDI element.

4. The semiconductor device according to claim 1, further comprising a second continuous BDI element below the second pair of FET gate structures and including the second BDI element.

5. The semiconductor device according to claim 4, wherein the second S/D region extends below an upper surface of the second continuous BDI element.

6. The semiconductor device according to claim 1, wherein the first gate canyon spacing exceeds the second gate canyon spacing.

7. The semiconductor device according to claim 1, wherein the first S/D region extends below an upper surface of the semiconductor substrate.

8. A semiconductor device comprising:
    a semiconductor substrate;
    a first pair of FET (field effect transistor) gate structures separated by a first gate canyon and having a first gate canyon spacing disposed upon the semiconductor substrate;
    a first S/D (source/drain region) disposed in the first gate canyon; and
    a first BDI (bottom dielectric isolation) element disposed below the first pair of FET gate structures and the first S/D region;
    wherein the first BDI element comprises a first thickness below the first pair of FET gate structures and a second thickness below the first S/D region;
    wherein the first BDI element extends into the semiconductor substrate; and
    wherein the first S/D region extends below an upper surface of the first BDI element.

9. The semiconductor device according to claim 8, further comprising:
    a second pair of FET gate structures separated by a second gate canyon having a second gate canyon spacing;
    a second S/D region disposed in the second gate canyon; and
    a second BDI element disposed below the second pair of FET gate structures and the second S/D region.

10. The semiconductor device according to claim 9, wherein the second S/D region extends below an upper surface of the second BDI element.

11. The semiconductor device according to claim 9, further comprising a second continuous BDI element below the second pair of FET gate structures and including the second BDI element.

12. The semiconductor device according to claim 9, wherein the first gate canyon spacing exceeds the second gate canyon spacing.

13. The semiconductor device according to claim 9, wherein the second BDI element extends into the semiconductor substrate.

14. A method of fabricating a semiconductor device, the method comprising:
    forming a nanosheet layer stack including a bottom sacrificial nanosheet layer;
    forming fins from the nanosheet stack;
    forming dummy gates upon the fins;
    recessing the fins between otherwise adjacent dummy gates;
    removing the bottom sacrificial nanosheet layer;
    forming a bottom dielectric isolation layer below the nanosheet stack;
    recessing the bottom dielectric isolation layer between otherwise adjacent dummy gates; and
    forming source/drain regions adjacent to the bottom dielectric layer and the otherwise adjacent dummy gates.

15. The method of fabricating a semiconductor device according to claim 14, further comprising forming inner spacers between otherwise adjacent nanosheets.

16. The method of fabricating a semiconductor device according to claim 14, further comprising forming gate sidewall spacers adjacent to the dummy gate.

17. The method of fabricating a semiconductor device according to claim 14, wherein the bottom dielectric isolation layer comprises a flowable dielectric material.

18. The method of fabricating a semiconductor device according to claim 14, wherein at least one source/drain region extends below an upper surface of the bottom dielectric layer.

19. The method of fabricating a semiconductor device according to claim 14, wherein the bottom dielectric isolation layer comprises a continuous layer beneath the nanosheet stack and the source/drain regions.

* * * * *